US008239812B2

(12) United States Patent
Nishioka et al.

(10) Patent No.: US 8,239,812 B2
(45) Date of Patent: Aug. 7, 2012

(54) SEMICONDUCTOR DEVICE, ADJUSTMENT METHOD THEREOF AND DATA PROCESSING SYSTEM

(75) Inventors: Naohisa Nishioka, Tokyo (JP); Chikara Kondo, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 117 days.

(21) Appl. No.: 12/923,792

(22) Filed: Oct. 7, 2010

(65) Prior Publication Data

US 2011/0084744 A1    Apr. 14, 2011

(30) Foreign Application Priority Data

Oct. 9, 2009   (JP) ................................ 2009-235493

(51) Int. Cl.
*G06F 17/50*    (2006.01)
(52) U.S. Cl. ....................................... 716/134; 716/108
(58) Field of Classification Search .................. 716/134, 716/108
See application file for complete search history.

(56) References Cited

U.S. PATENT DOCUMENTS 7,123,497 B2 * 10/2006 Matsui et al. ................... 365/51
2007/0250743 A1 * 10/2007 Matsubara et al. ........... 714/712
2007/0277071 A1 * 11/2007 Chong et al. .................. 714/744
2007/0282555 A1 * 12/2007 Chong et al. .................. 702/107
2008/0201099 A1 * 8/2008 Suda et al. .................... 702/118
2009/0146716 A1 * 6/2009 Ide et al. ....................... 327/276
2009/0228752 A1 * 9/2009 Sawamura .................... 714/731
2009/0295404 A1 * 12/2009 Matsumoto et al. .......... 324/555
2010/0039157 A1 * 2/2010 Kaeriyama et al. ........... 327/292
2011/0093735 A1 * 4/2011 Yoko et al. .................... 713/500

FOREIGN PATENT DOCUMENTS

JP      2004-185608     7/2004
JP      2004-327474    11/2004

* cited by examiner

*Primary Examiner* — Suchin Parihar
(74) *Attorney, Agent, or Firm* — McGinn IP Law Group, PLLC

(57) ABSTRACT

Read data that are output from core chips are accurately captured into an interface chip. Each of the core chips includes a data output circuit that outputs read data to the interface chip in response to a read command, and an output timing adjustment circuit that adjusts the period of time required from the reception of the read command to the outputting of the read data from the data output circuit. The interface chip includes a data input circuit that captures read data, and an input timing adjustment circuit that adjusts the timing for the data input circuit to allow the capturing of the read data after issuing the read command. In this manner, a sufficient latch margin for read data on the interface chip side can be secured.

20 Claims, 18 Drawing Sheets

[TRUTH TABLE]
① A>B

| A | B | C |
|---|---|---|
| 0 | 0 | 0 |
| 0 | 1 | 0 |
| 1 | 0 | 1 |
| 1 | 1 | 0 |

[TRUTH TABLE]
② A=B

| A | B | D |
|---|---|---|
| 0 | 0 | 1 |
| 0 | 1 | 0 |
| 1 | 0 | 0 |
| 1 | 1 | 1 |

| A | B | Ci | C |
|---|---|----|---|
| 0 | 0 | 0  | 0 |
| 0 | 1 | 0  | 0 |
| 1 | 0 | 0  | 1 |
| 1 | 1 | 0  | 0 |
| 0 | 0 | 1  | 1 |
| 0 | 1 | 1  | 1 |
| 1 | 0 | 1  | 1 |
| 1 | 1 | 1  | 1 |

| A | B | Di | D |
|---|---|----|---|
| 0 | 0 | 0  | 0 |
| 0 | 1 | 0  | 0 |
| 1 | 0 | 0  | 0 |
| 1 | 1 | 0  | 0 |
| 0 | 0 | 1  | 1 |
| 0 | 1 | 1  | 0 |
| 1 | 0 | 1  | 0 |
| 1 | 1 | 1  | 1 |

| TCO | | | | | | | AMOUNT OF DELAY |
|---|---|---|---|---|---|---|---|
| 1 | 2 | 3 | 4 | 5 | 6 | 7 | |
| 0 | 0 | 0 | 0 | 0 | 0 | 0 | DEFAULT |
| 1 | 0 | 0 | 0 | 0 | 0 | 0 | +1 |
| 1 | 1 | 0 | 0 | 0 | 0 | 0 | +2 |
| 1 | 1 | 1 | 0 | 0 | 0 | 0 | +3 |
| 1 | 1 | 1 | 1 | 0 | 0 | 0 | +4 |
| 1 | 1 | 1 | 1 | 1 | 0 | 0 | +5 |
| 1 | 1 | 1 | 1 | 1 | 1 | 0 | +6 |
| 1 | 1 | 1 | 1 | 1 | 1 | 1 | +7 |

FIG.15

SEMICONDUCTOR DEVICE, ADJUSTMENT METHOD THEREOF AND DATA PROCESSING SYSTEM

BACKGROUND OF THE INVENTION

1. Field of the Invention

The present invention relates to a semiconductor device, an adjustment method thereof and a data processing system including the semiconductor device. More particularly, the present invention relates to a semiconductor device that includes plural core chips and an interface chip to control the cores, an adjustment method thereof and a data processing system including the semiconductor device.

2. Description of the Related Art

A memory capacity that is required in a semiconductor device such as a dynamic random access memory (DRAM) has increased every year. In recent years, a memory device that is called a multi-chip package where plural memory chips are laminated is suggested to satisfy the required memory capacity. However, since the memory chip used in the multi-chip package is a common memory chip capable of operating even though the memory chip is a single chip, a so-called front end unit that performs a function of an interface with an external device (for example, memory controller) is included in each memory chip. For this reason, an area for a memory core in each memory chip is restricted to an area obtained by subtracting the area for the front end unit from a total chip area, and it is difficult to greatly increase a memory capacity for each chip (for each memory chip).

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that integrates the front end unit and the back end unit in individual chips and laminates these chips, thereby constituting one semiconductor device, is suggested (for example, Japanese Patent Application Laid-Open No. 2004-327474). According to this method, with respect to plural core chips each of which is integrated with the back end unit, it becomes possible to increase a memory capacity for each chip (for each core chip) because an occupied area assignable for the memory core increases. Meanwhile, with respect to an interface chip that is integrated with the front end unit and is common to the plural core chips, it becomes possible to form its circuit with a high-speed transistor because the interface chip can be manufactured using a process different from that of the memory core. In addition, since the plural core chips can be allocated to one interface chip, it becomes possible to provide a semiconductor device that has a large memory capacity and a high operation speed as a whole.

However, since there occurs a deviation in operation speed among the core chips due to the manufacturing process conditions, the period of time from the receipt of a read command to the outputting of read data also varies among the core chips. As a result, the latch margin of the read data for the interface chip becomes smaller, and in some cases, read data cannot be accurately latched.

As a method for solving the above problem, in Japanese Patent Application Laid-Open No. 2004-185608, although a semiconductor device that has a front-end unit and a back-end unit separated from each other is not disclosed, it is disclosed that a method of adjusting a latch timing of data output from a memory in a device which has the memory and an LSI connected thereto.

In a semiconductor device that has a front-end unit and a back-end unit separated from each other, however, a plurality of the core chips constituting the back-end unit are allotted to the single interface chip forming the front-end unit. Therefore, if the technique disclosed in Japanese Patent Application Laid-Open No. 2004-185608 is applied to this type of semiconductor device, the same number of latch timing control circuits as the number of core chips are required in the interface chip. In other words, latch timing control circuits corresponding to the respective core chips are required in the interface chip. This is because the core chips are independent of one another, and variations due to the manufacturing process conditions exist among the core chips. Even if the respective core chips have the same functions and are manufactured with the use of the same manufacturing mask, the core chips have different properties from one another due to the respective specific manufacturing process conditions (for example, the delay speed per unit circuit). As a result, the core chips operate at different speeds from one another. Furthermore, the number of core chips to be allotted to an interface chip is not necessarily determined during the manufacture of the interface chip. Therefore, according to the technique disclosed in Japanese Patent Application Laid-Open No. 2004-185608, it is necessary to prepare the same number of latch timing control circuits as the maximum number of core chips that can be allotted to an interface chip, resulting in a large amount of wastes in some chip structure.

SUMMARY

In one embodiment, there is provided a semiconductor device comprising: a plurality of core chips each including an output terminal; and an interface chip that includes an input terminal electrically connected to the output terminals in common, and a data input circuit that receives a plurality of read data supplied from the output terminals via the input terminal, the interface chip issuing at least a read command to the core chips, wherein each of the core chips includes a data output circuit that outputs the read data to the output terminal in response to the read command, and an output timing adjustment circuit that adjusts an output period from a first time to a second time, the output period being a period of time from reception of the read command to outputting of the read data from the data output circuit to the output terminal, the first time being a minimum time of the output period, the interface chip includes an input timing adjustment circuit that adjusts an input period from a third time to a fourth time, the input period being a period of time from issuance of the read command to capturing of the read data from the input terminal into the data input circuit, the third time being a minimum time of the input period, and the second times and the fourth time are substantially same as longest time among the first times and the third time.

In one embodiment, there is provided a method for adjusting a semiconductor device comprising: providing the semiconductor device that includes a plurality of core chips each including an output terminal, and an interface chip that includes an input terminal electrically connected to the output terminals in common; detecting an operation speed difference between a first operation speed of each of the core chips and a second operation speed of the interface chip; adjusting an output period in each of the core chips from a first time to a second time based on respective operation speed difference and an operation speed difference of the slowest core chip, the output period being a period of time in each of the core chips from reception of a read command issued from the interface chip to the core chips to outputting of read data to the interface chip, the first time being a minimum time of the output period, and adjusting an input period in the interface chip from a third time to a fourth time based on operation speed difference of the slowest core chip, the input period being a period of time in the interface chip from issuance of the read command to capturing of read data output from the core chips, thereby the first time of the slowest core chip, the second times of the core chips other than the slowest core chips, and the fourth time of the interface chip are substantially same as each other.

In one embodiment, there is provided a data processing system that includes: the above-described semiconductor device and a controller that is connected to the semiconductor device, wherein the controller issues a command related to the read command to the interface chip, the interface chip issues the read command to the core chips, upon receipt of the command from the controller, one of the core chips outputs the read data corresponding to the read command to the interface chip, upon receipt of the read command, the interface chip outputs the read data to the controller, upon receipt of the read data from one of the core chips.

According to the present invention, an output timing adjustment circuit is provided in each of the core chips, and an input timing adjustment circuit is provided in the interface chip. In the respective output timing adjustment circuits and the input timing adjustment circuit, the respective times are adjusted to the longest time among the respective first times and the third time, so that a sufficient latch margin for the sets of read data that are output from the respective core chips can be secured on the interface chip side (a common latch margin is secured). Furthermore, each of the core chips adjusts the timing to output the corresponding read data on the core chip side, and accordingly, there is no need to provide the same number of latch timing control circuits as the number of core chips on the interface chip side. In other words, on the interface chip side, the input timing (the timing to latch read data) is adjusted only to match the longest time among the respective first times. Moreover, since there is an input timing adjustment circuit provided in the interface chip, even if the output timing cannot be made any earlier on the core chip side, read data can be accurately captured on the interface chip side by delaying the input timing on the interface chip side.

BRIEF DESCRIPTION OF THE DRAWINGS

The above features and advantages of the present invention will be more apparent from the following description of certain preferred embodiments taken in conjunction with the accompanying drawings, in which:

FIG. 15 is a table for explaining the relationships between the output timing data TCO [7:0] and the set amounts of delay;

DETAILED DESCRIPTION OF THE EMBODIMENTS

Figure 1:
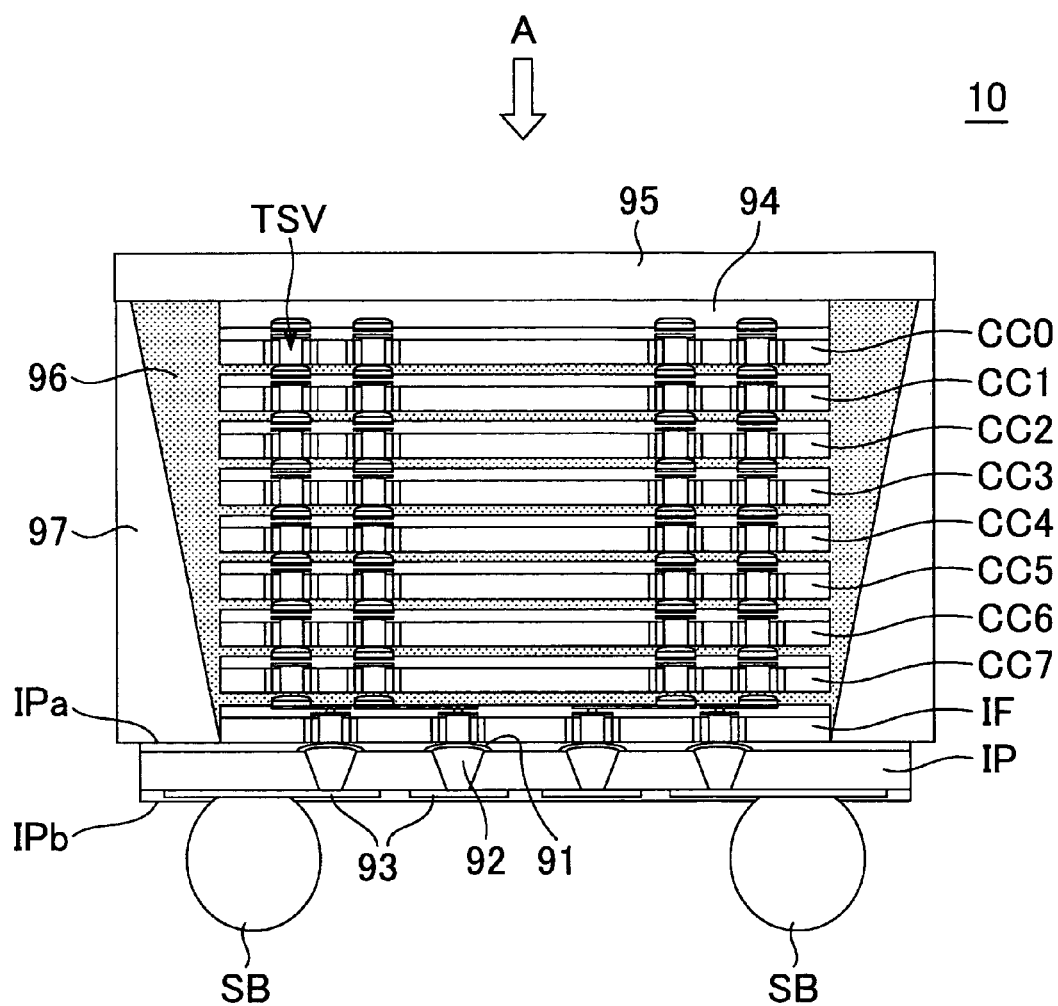
FIG. 1 is a schematic cross-sectional view for explaining the structure of a semiconductor device 10 according to the preferred embodiment of the present invention.

The following is a typical example of the technical concept of the present invention to solve the above mentioned problems. However, the contents claimed in this application are not limited to the technical concept, and are of course disclosed in the claims of this application. More specifically, according to the present invention, the core chip with the lowest operation speed is identified by measuring the operation speed difference between an interface chip and each core chip, with the operation speed of the interface chip being the reference speed. The interface chip side issues a read command to each core chip side, and, having received the read command, each core chip side outputs the corresponding read data. With the timing for the core chip with the lowest operation speed identified by the measurement being the reference timing, the timing to output the read data is adjusted to the timing for the core chip with the lowest operation speed to output the read data on each core chip side (the sides of the other core chips). Furthermore, with the timing for the core chip with the lowest operation speed to output the read data being the reference timing on the interface chip side, the timing to input the read data is adjusted. With this technical concept, each core chip can adjust its period of time required from the reception of the read command to the outputting of the read data, to the corresponding periods of time required in the other core chips. Also, the timing for the interface chip side to capture the sets of read data that are output from the respective core chips can be synchronized with the common timing based on the timing for the core chip with the lowest operation speed to output read data. As a result, with the reference timing being the period of time required from the reception of the read command derived from the process conditions of the core chip with the lowest operation speed to the capturing of the corresponding read data, the variation in the operation speed due to the respective process conditions of the core chips and the variation in the operation speed due to the process conditions of the interface chip cancel each other out. Accordingly, this technical concept is effective in a unique structure in which the respective output signals (or the respective output circuits) of the core chips are commonly connected to one input circuit of the interface chip. In a first example of the unique structure, the core chips each have the same function, and are manufactured with the use of the same manufacturing mask. In a second example, the core chips each have a memory function, but also have different functions from one another (a first core chip is a DRAM, a second core chip is a SRAM, a third core chip is a nonvolatile memory, and a fourth core chip is a DSP). The core chips are manufactured with the use of different manufacturing masks from one another.

The following technical concept is also disclosed. With the operation speed of the interface chip being the reference speed, the operation speed of each of the core chips is measured, and the operation speed of the interface chip and the operation speeds of the respective core chips are advantageously adjusted to the operation speed of the core chip with the lowest operation speed. This is because the interface chip is manufactured under different manufacturing conditions from the core chips, and the interface chip has the function of a front end with respect to the outside while the core chips have the function of a back end. More specifically, the interface chip communicates with the outside, and transmits a specific command as a result of the communication to the core chips of the back end. The interface chip then receives data from the back end in relation to the specific command. In other words, the interface chip is the transmitter (the first driver) of a trigger signal of a command (such as a read command) for the core chips, and is the recipient (the first receiver) of the data in relation to the trigger signal. Meanwhile, each of the core chips includes a second receiver that receives the trigger signal output from the first driver of the interface chip, and a second driver that outputs the data in relation to the trigger signal. Accordingly, the first predetermined period of time (the first latency) required from the first driver circuit to the first receiver circuit in the interface chip and the second predetermined period of time (the second latency) required from the second receiver circuit to the second driver circuit in each core chip are in a so-called lacing relationship, and it is essential that the first latency matches the second latencies in terms of time. In each of the chips, the first and second latencies are made uniform. Since the interface chip is manufactured under different manufacturing conditions from those for the core chips, and the core chips are manufactured under different manufacturing conditions from one another, the first latency is put into lacing relationships timewise with the respective second latencies. The most effective way to solve this is to measure the differences in time between the second latencies of the respective core chips and the first latency designed under the manufacturing conditions for the interface chip functioning as the front end. This is because the interface chip is the transmitter of the trigger signal. Meanwhile, to adjust the respective second latencies of the core chips, the second latencies might need to be adjusted in a negative direction to shorten the delay time (negative offset), with the first latency of the interface chip being the reference latency for all. This is a case where the first latency is shorter than the second latencies. However, a core chip normally have a circuit design with the shortest period of time to achieve higher speed with respect to the so-called data critical path line from the storage unit in the core chip to the data output terminal of the core chip in some cases. In such a case, the time component of the critical path line cannot be shortened any more (cannot cope with a request for the negative offset). In other words, in the core chips, a semiconductor device 10 including core chips that cannot realize the negative offset is virtually set. To cope with this, the technical concept of this application suggests that it is most preferable to adjust the latencies of other chips to the latency of the slowest chip, with the reference chip being the chip with the longest first or second latency. In such a case, the second latency in the interface chip designed to cope with the respective sets of read data from the core chips with a single receiver is only adjusted to the latency of the slowest chip. Therefore, there is no need to adjust or change a large number of latencies that vary among the chips.

Further, the following technical concept is disclosed. After an interface chip and core chips are assembled as a semiconductor device, the operation speed of each of the core chips is measured, with the reference speed being the operation speed of the interface chip, and the operation speeds of the other chips are advantageously adjusted, with the reference speed being the operation speed of the slowest core chip. This is because the physical distances among the interface chip and the core chips vary. Particularly, in a semiconductor device that is formed with core chips and one interface chip, the potentials of the respective power lines from a power-supply terminal outside the semiconductor device to the core chips and the interface chip in the semiconductor device might vary among the chips due to parasitic resistance or the like in the semiconductor device. In this case, the first latency differs from the second latencies. For example, the core chips and the interface chip are stacked on one another to form a semiconductor device, and there might be differences among the power-supply potentials in the internal chip farthest from the power-supply terminal as an external terminal of the semiconductor device and in the chip closest to the power-supply terminal. Furthermore, in a case where power is supplied from the interface chip to each core chip, there might be a difference in power-supply potentials between the core chip farthest from the interface chip and the core chip closest to the interface chip.

Preferred embodiments of the present invention will be explained below in detail with reference to the accompanying drawings.

FIG. 1 is a schematic cross-sectional view provided to explain the structure of a semiconductor device 10 according to the preferred embodiment of the present invention.

As shown in FIG. 1, the semiconductor device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural through silicon vias TSV penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/ serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
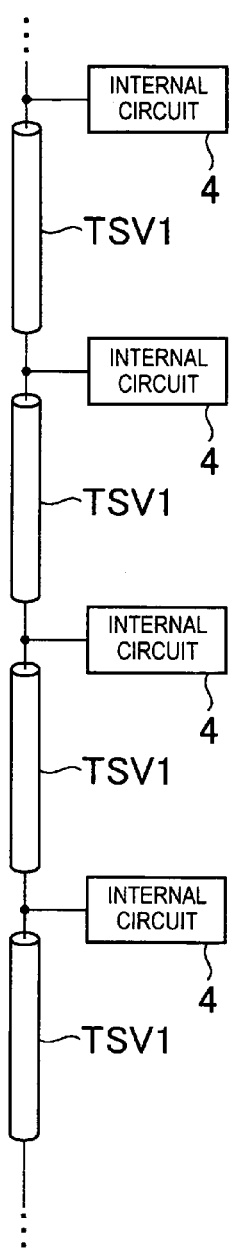
FIGS. 2A to 2C are diagram for explaining the various types of through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
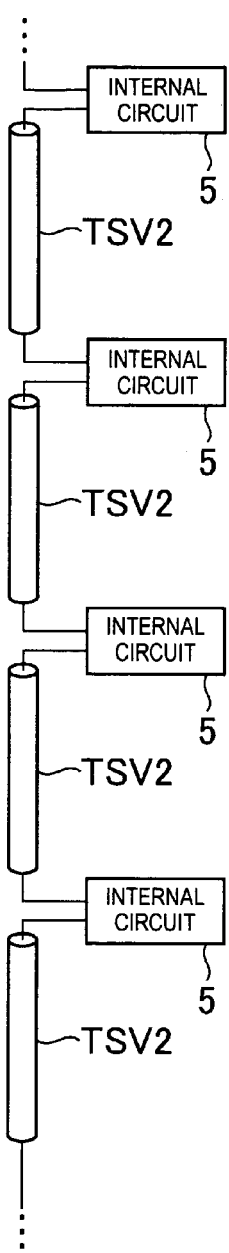

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Figure 2C:
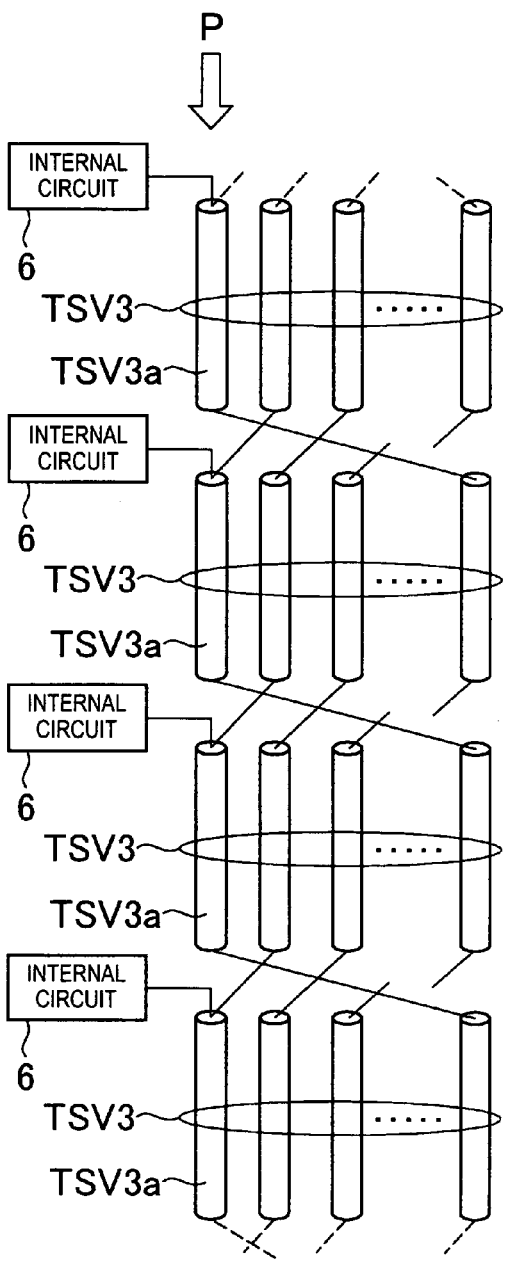

Another group of through silicon vias TSV is short-circuited from the TSVs of other layer provided at the different position in plan view, as shown in FIG. 2C. With respect to this kind of group of through silicon via TSV3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal, a command signal, and a clock signal are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 having the same structure.

Figure 3:
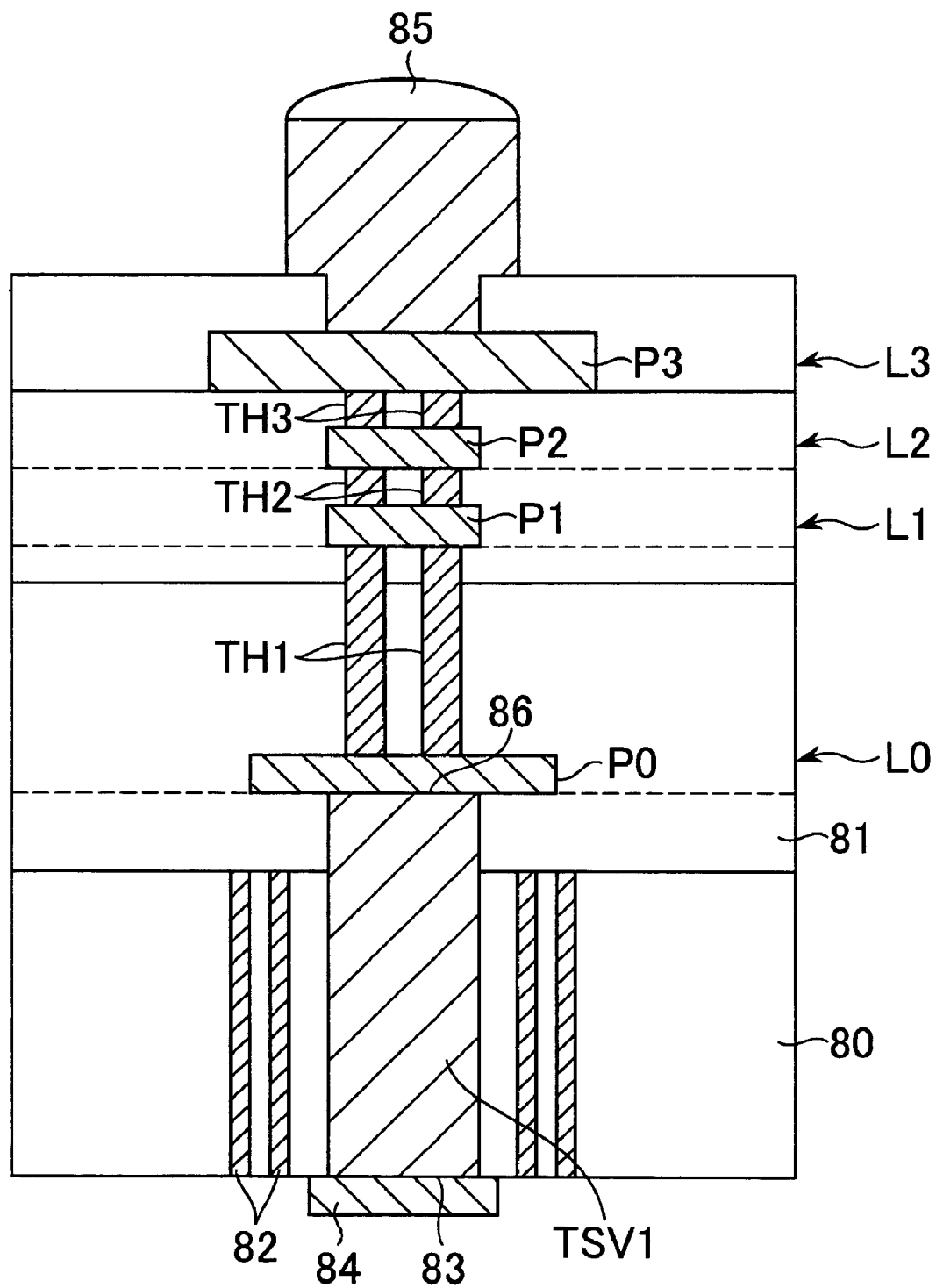
FIG. 3 is a cross-sectional view showing the structure of the through silicon via TSV1 of the type shown in FIG. 2A.

FIG. 3 is a cross-sectional view showing the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
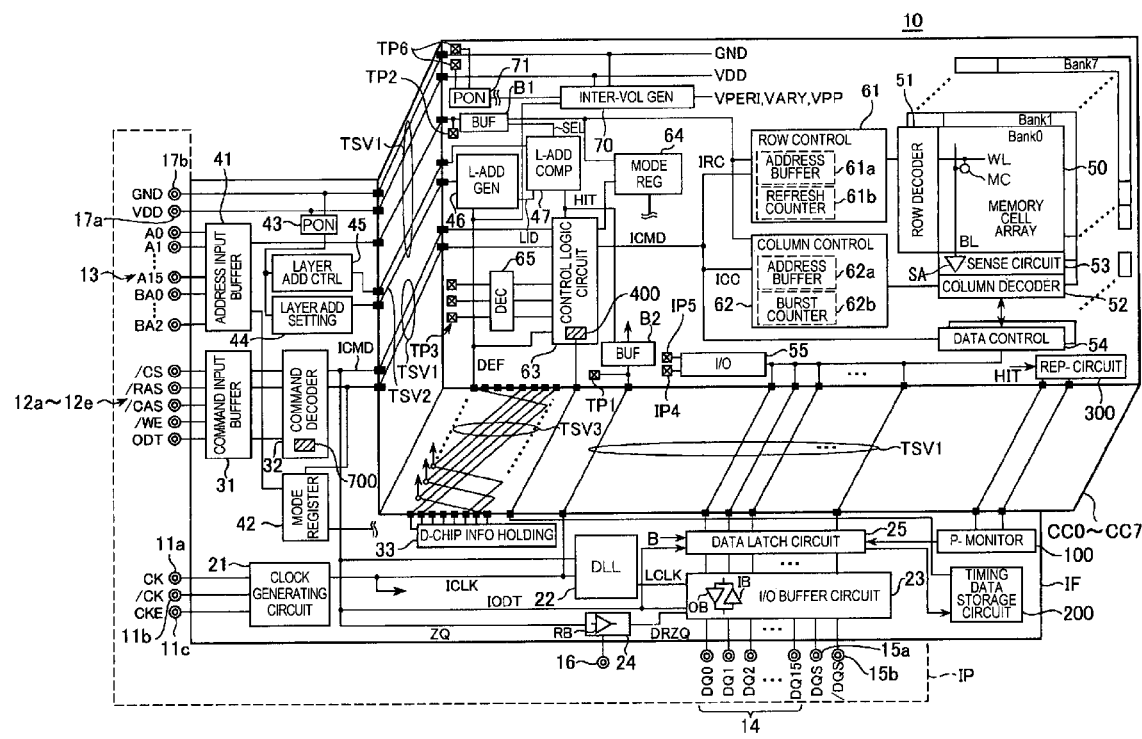
FIG. 4 is a block diagram showing the circuit configuration of the semiconductor device 10.

FIG. 4 is a block diagram showing the circuit configuration of the semiconductor device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV. As shown in FIG. 4, the command decoder 32 includes an input timing adjustment circuit 700. The input timing adjustment circuit 700 adjusts an input timing of read data based on an output timing data stored in a timing data storage circuit 200 in the interface chip IF.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor device 10 cannot be tested in case an assembly process of the interface chip and the plural core chips is not executed, and the interface chip is tested by testing the semiconductor device 10. In this case, when a defect that cannot be recovered exists in the interface chip, the entire semiconductor device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects power activation. On detecting power activation, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, by using the through silicon via TSV3 of the type shown in FIG. 2C.

A process monitor circuit 100 is further provided in the interface chip IF. The process monitor circuit 100 measures the operation speeds of replica circuits 300 provided in the core chips CC0 to CC7, to detect an operation speed difference caused by process conditions between the interface chip IF and each of the core chips CC0 to CC7. The results of the detection are stored into the timing data storage circuit 200 provided in the interface chip IF, and is transferred to an output timing adjustment circuit 400 provided in each of the core chips CC0 to CC7 at the time of power activation. The process monitor circuit 100 and the likes will be described later in detail. The timing data storage circuit 200 may be provided in each of the core chips CC0 to CC7.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor device 10 are shared. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. As shown in FIG. 4, the control logic circuit 63 includes the output timing adjustment circuit 400. The output timing adjustment circuit 400 adjusts an output timing of read data based on an output timing data stored in the timing data storage circuit 200 in the interface chip IF. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46. When the layer address comparing circuit 47 detects a match, it activates a match signal HIT. The match signal HIT is supplied to the control logic circuit 63 and the replica circuits 300.

In the layer address generating circuit 46, unique layer addresses are set to the core chips CC0 to CC7, respectively, at initialization. A method of setting the layer addresses is as follows. First, after the semiconductor device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When power activation is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor device 10 cannot be tested, before the interface chip and the plural core chips are fully assembled. In other words, the individual core chips are tested when testing the semiconductor device 10. When unrecoverable defect exists in the core chips, the entire semiconductor device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor device 10. Because in the semiconductor device 10, the 8 core chips of 1 Gb are laminated, the semiconductor device 10 has a memory capacity of 8 Gb in total. Because the chip selection signal /CS is input to one terminal (chip selection terminal), the semiconductor device is recognized as a single DRAM having the memory capacity of 8 Gb, in view of the controller.

Figure 5:
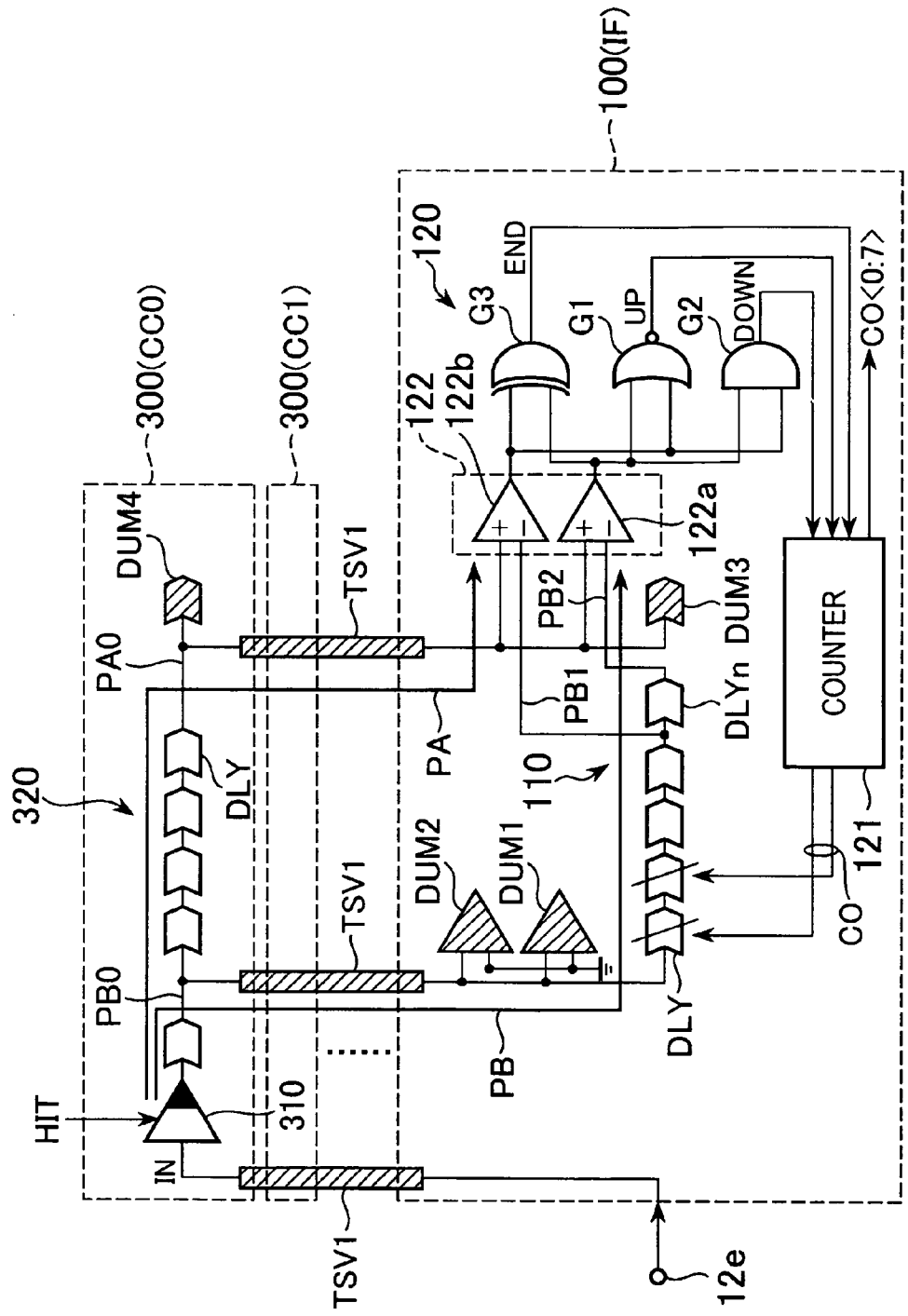
FIG. 5 is a circuit diagram of the process monitor circuit 100 and the replica circuits 300.

FIG. 5 is a circuit diagram of the process monitor circuit 100 and the replica circuits 300.

The replica circuits 300 are circuits provided in the respective core chips CC0 to CC7, and as shown in FIG. 5, each of the replica circuits 300 includes a select buffer 310 and a fixed delay circuit 320 connected in cascade. The fixed delay circuit 320 has a structure in which delay elements DLY are cascade-connected. A clock signal IN is collectively input from the interface chip IF to the select buffers 310 of the respective core chips CC0 to CC7 via through silicon via TSV1. A delayed signal PB0 is extracted from the input terminal of each fixed delay circuit 320, and a delayed signal PA0 is extracted from the output terminal of each fixed delay circuit 320. The delayed signals PB0 and PA0 that are output from each of the core chips CC0 to CC7 are supplied to the process monitor circuit 100 of the interface chip IF via the same through silicon via TSV1. In this embodiment, the clock signal IN to be supplied to the replica circuits 300 is a clock signal that is input to the command terminal 12e (the terminal to which the on-die termination signal ODT is input during a regular operation). However, the clock signal IN is not limited to that, and any kinds of signals may be used. Also, the clock signal IN is not limited to a signal supplied from outside, but may be a signal that is generated inside the interface chip IF.

The amount of delay in each signal path formed with the select buffer 310 and the fixed delay circuit 320 is designed to be the same as the amount of delay in the control logic circuit 63 and the data control circuit 54. In other words, each replica circuit 300 is a replica of the control logic circuit 63 and the data control circuit 54. Accordingly, where the signal transmission time of the control logic circuit 63 and the data control circuit 54 is longer than a set value due to a result of manufacturing conditions and the likes, the delay time of each replica circuit 300 becomes longer due to a result of the manufacturing conditions and the likes. On the other hand, where the signal transmission time of the control logic circuit 63 and the data control circuit 54 is shorter than a set value due to a result of the manufacturing conditions and the likes, the delay time of each replica circuit 300 also becomes shorter due to a result of the manufacturing conditions and the likes. In other words, the replica circuits 300 of the respective core chips CC0 to CC7 each have a specific amount of delay determined by the corresponding process conditions.

Each select buffer 310 is a circuit that operates when the match signal HIT is activated. The match signal HIT is a signal that becomes valid in one of the core chips CC0 to CC7, for example. Accordingly, the clock signal IN collectively supplied from the interface chip IF to the respective core chips CC0 to CC7 becomes active in one of the core chips CC0 to CC7. In other words, the delayed signals PB0 and PA0 are supplied from a selected core chip to the interface chip IF.

The delayed signals PB0 and PA0 are input to the process monitor circuit 100 in the interface chip IF. As shown in FIG. 5, the process monitor circuit 100 includes a variable delay circuit 110 that is capable of varying the amount of delay, and a delay control circuit 120 that adjusts the amount of delay in the variable delay circuit 110.

The variable delay circuit 110 is a circuit that is capable of adjusting the amount of delay in the variable delay circuit 110, based on an adjustment code CO supplied from the delay control circuit 120. The delayed signal PB0 is input to the input terminal of the variable delay circuit 110 via through silicon via TSV1. The delay control circuit 120 includes a counter 121 that generates adjustment codes CO that are count values, a phase comparator circuit 122 that is connected to the output terminal of the variable delay circuit 110 and the output terminals of the fixed delay circuits 320 via through silicon via TSV1, and gate circuits G1 through G3 that control the counter 121 based on the output of the phase comparator circuit 122. The through silicon vias TSV that connect the process monitor circuit 100 and the replica circuits 300 are preferably test through silicon vias TSV included in the group of through silicon vias TSV for data inputs and outputs to increase the monitor precision. The test through silicon vias TSV are based on a concept of a safety design used in an air craft or the like that physically uses two through silicon vias TSV for one electrical signal. With this concept, even if there is a problem with one of the through silicon vias TSV, the through silicon via TSV with the problem is not saved by other through silicon via TSV by a redundancy technique, and a test is carried out.

More specifically, the variable delay circuit 110 has a structure in which delay elements DLY are cascade-connected, and some of the delay elements DLY are skipped by adjustment codes CO. Here, "being skipped" means that a signal input to the input terminal is not delayed but is output as it is to the output terminal. With this arrangement, the amount of delay can be varied based on the adjustment code CO. As shown in FIG. 5, a delayed signal PB1 is extracted from the input terminal of the last delay element DLYn included in the variable delay circuit 110, and a delayed signal PB2 is extracted from the output terminal of the delay element DLYn. The delayed signals PB1 and PB2 are supplied to the inverting input terminals (−) of comparators 122a and 122b included in the phase comparator circuit 122. The delayed signals PA0 that are output from the fixed delay circuits 320 via through silicon via TSV1 are collectively input to the non-inverting input terminals (+) of the comparators 122a and 122b.

With this structure, the phases of the delayed signal PA0 that has passed through a signal path PA shown in FIG. 5 and the phases of the delayed signals PB1 and PB2 that have passed through a signal path PB are determined, and, based on the results, the gate circuits G1 through G3 generate an up-count signal UP, a down-count signal DOWN, or an adjustment end flag END. The outputs of those gate circuits G1 through G3 are supplied to the counter 121, and the count value (or the adjustment code CO) is counted up or down. In a case where the adjustment end flag END is activated, the current count value (the adjustment code CO) is output to a data latch circuit 25 shown in FIG. 4. In a case where the outputs of the comparators 122a and 122b are the same, or where the amount of delay in the variable delay circuit 110 of the interface chip IF matches the amount of delay in the fixed delay circuit 320 of a core chip, the adjustment end flag END is activated. Accordingly, the adjustment code CO obtained eventually is the information that indicates the difference between the operation speed of a selected core chip and the operation speed of the interface chip IF. The adjustment code CO supplied to the data latch circuit 25 is output to the outside of the semiconductor device 10 via the input/output buffer circuit 23 and the data input/output terminal 14.

Also, as shown in FIG. 5, dummy circuits DUM1 through DUM4 are provided in the process monitor circuit 100 and the replica circuits 300, so that the comparison conditions become uniform. Specifically, the dummy circuits DUM1 and DUM2 are dummy circuits of the comparators 122a and 122b, respectively, and are provided so that the load on the signal path PA matches the load on the signal path PB. The dummy circuits DUM3 and DUM4 are also provided so that the load on the signal path PA matches the load on the signal path PB.

Figure 6:
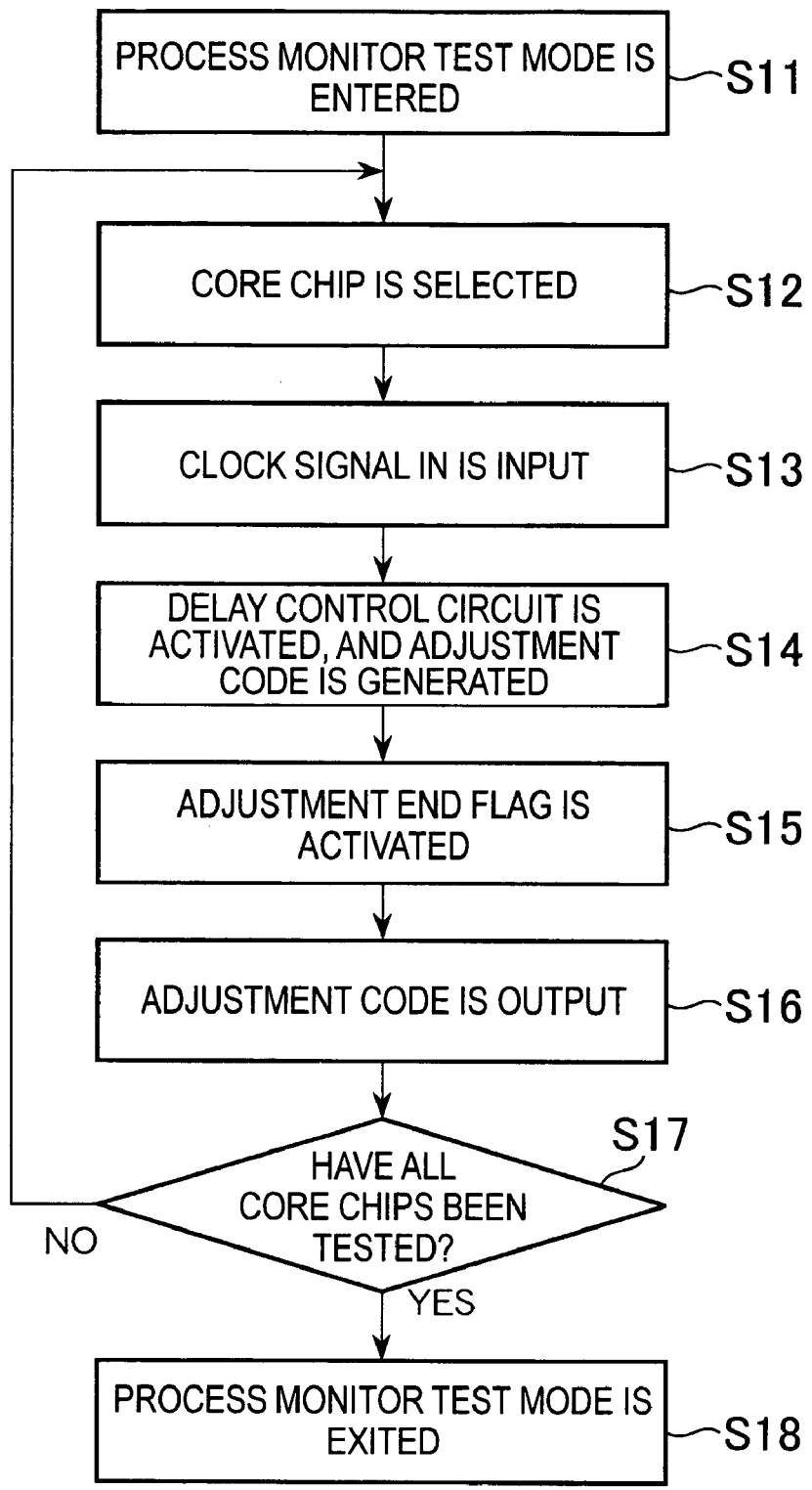
FIG. 6 is a flowchart for explaining a method for acquiring adjustment codes CO.

FIG. 6 is a flowchart for explaining a method for acquiring adjustment codes CO.

Figure 7:
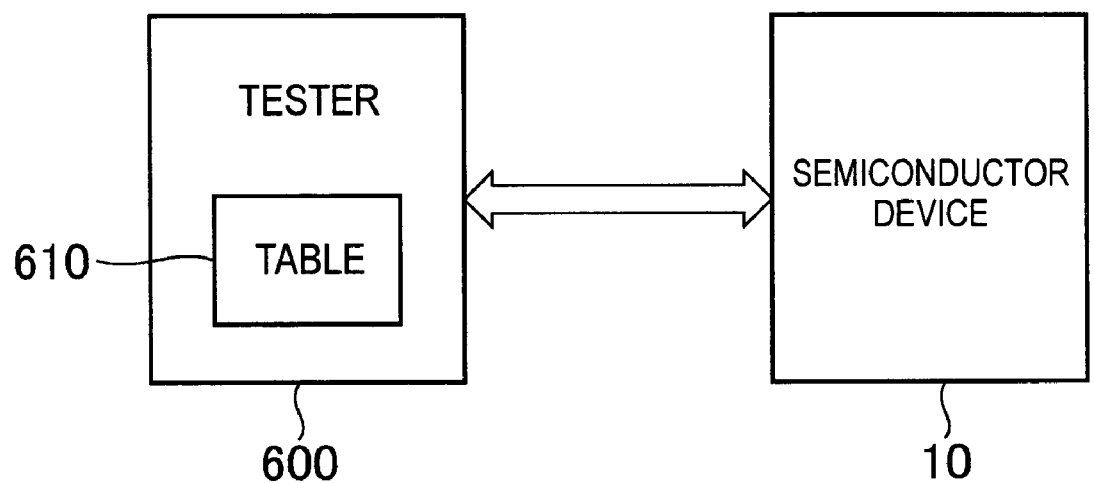
FIG. 7 is a block diagram showing a state that a tester 600 is connected to the semiconductor device 10.

First, a predetermined test command is issued from an external tester 600 shown in FIG. 7, so that the semiconductor device 10 enters a process monitor test mode (step S11). An operation in this test mode is performed by setting predetermined values in mode registers 42 and 64.

An address signal is then input from the tester 600, to select one of the core chips CC0 to CC7 (step S12). The match signal HIT is activated in one of the core chips CC0 to CC7, so that the select buffer 310 shown in FIG. 5 is put into an operable state. By inputting the clock signal IN from the command terminal 12e in this situation, the clock signal IN is supplied to the replica circuit 300 of each of the core chips CC0 to CC7 (step S13). Here, only the select buffer 310 in the selected core chip is operating, and accordingly, the clock signal IN is transmitted only to the replica circuit 300 in the selected core chip.

The delay control circuit 120 in the process monitor circuit 100 is then activated to generate an adjustment code CO (step S14). More specifically, in accordance with the phase of the delayed signal PA0 that has passed through the signal path PA shown in FIG. 5 and the phases of the delayed signals PB1 and PB2 that have passed through the signal path PB, the adjustment code CO is counted up or down. This operation is repeated until the amount of delay in the variable delay circuit 110 becomes equal to the amount of delay in the fixed delay circuit 320. When the amount of delay in the variable delay circuit 110 becomes equal to the amount of delay in the fixed delay circuit 320, the adjustment end flag END is activated (step S15), and the adjustment code CO obtained at this point is output to the tester via the data input/output terminal 14 (step S16).

The above described operation is performed for each of the core chips CC0 to CC7 by switching layer addresses. When the tests on all the core chips CC0 to CC7 are completed (YES in step S17), the operation exits the process monitor test mode, and the series of procedures comes to an end (step S18).

When the above described procedures are completed, the adjustment code CO corresponding to each of the core chips CC0 to CC7 is stored into a table 610 in the tester 600. The adjustment codes CO stored into the tester in this manner are written as they are into the timing data storage circuit 200 in the interface chip IF or are written into the timing data storage circuit 200 after being converted inside the tester 600 if necessary. However, this conversion is not necessary, and the adjustment codes CO written in the table 610 may be written as they are into the timing data storage circuit 200.

Figure 8:
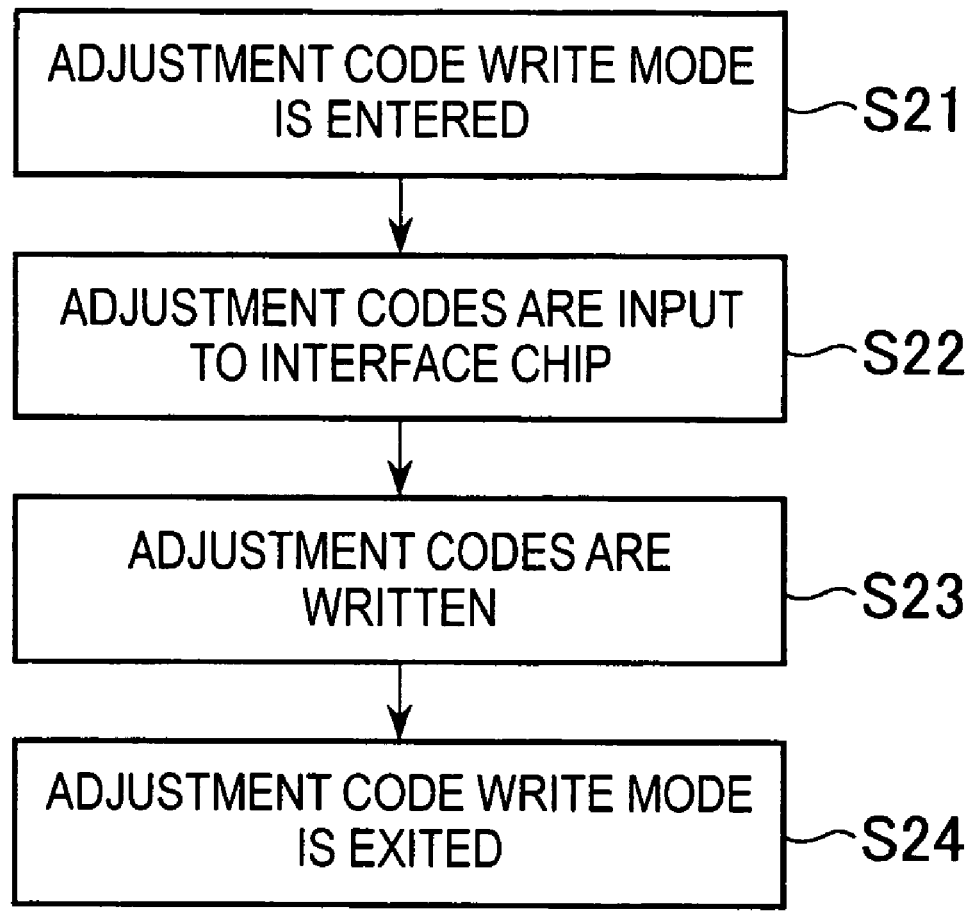
FIG. 8 is a flowchart for explaining an operation to write the adjustment codes CO into the timing data storage circuit 20.

FIG. 8 is a flowchart for explaining an operation to write the adjustment codes CO into the timing data storage circuit 200.

First, a predetermined test command is issued from the tester 600 shown in FIG. 7, so that the semiconductor device 10 enters an adjustment code CO write mode (step S21). An operation in this test mode is performed by setting predetermined values in the mode registers 42 and 64.

The adjustment codes CO stored in the table 610 in the tester 600 are then input to the interface chip IF via the data input/output terminal 14 (step S22). The adjustment codes CO input to the interface chip IF are supplied to the timing data storage circuit 200. Nonvolatile memory elements such as anti-fuse elements are provided in the timing data storage circuit 200, and the adjustment codes CO are written into those nonvolatile memory elements (step S23).

When the writing of the adjustment codes CO is completed, the operation exits the adjustment code CO write mode, and the series of procedures comes to an end (step S24). As described above, in this embodiment, the adjustment codes CO corresponding to the respective core chips CC0 to CC7 are not stored in the respective core chips CC0 to CC7, but are collectively stored in the timing data storage circuit 200 in the interface chip IF. The adjustment codes CO stored in the timing data storage circuit 200 in this manner are read out at the time of power activation, and predetermined calculations are performed by an arithmetic circuit 210 in the timing data storage circuit 200. The results calculated by the arithmetic circuit 210 may be stored into the timing data storage circuits 200. In this manner, the later described calculation time (step S34 and step S35) required at the time of power activation is shortened.

Figure 9:
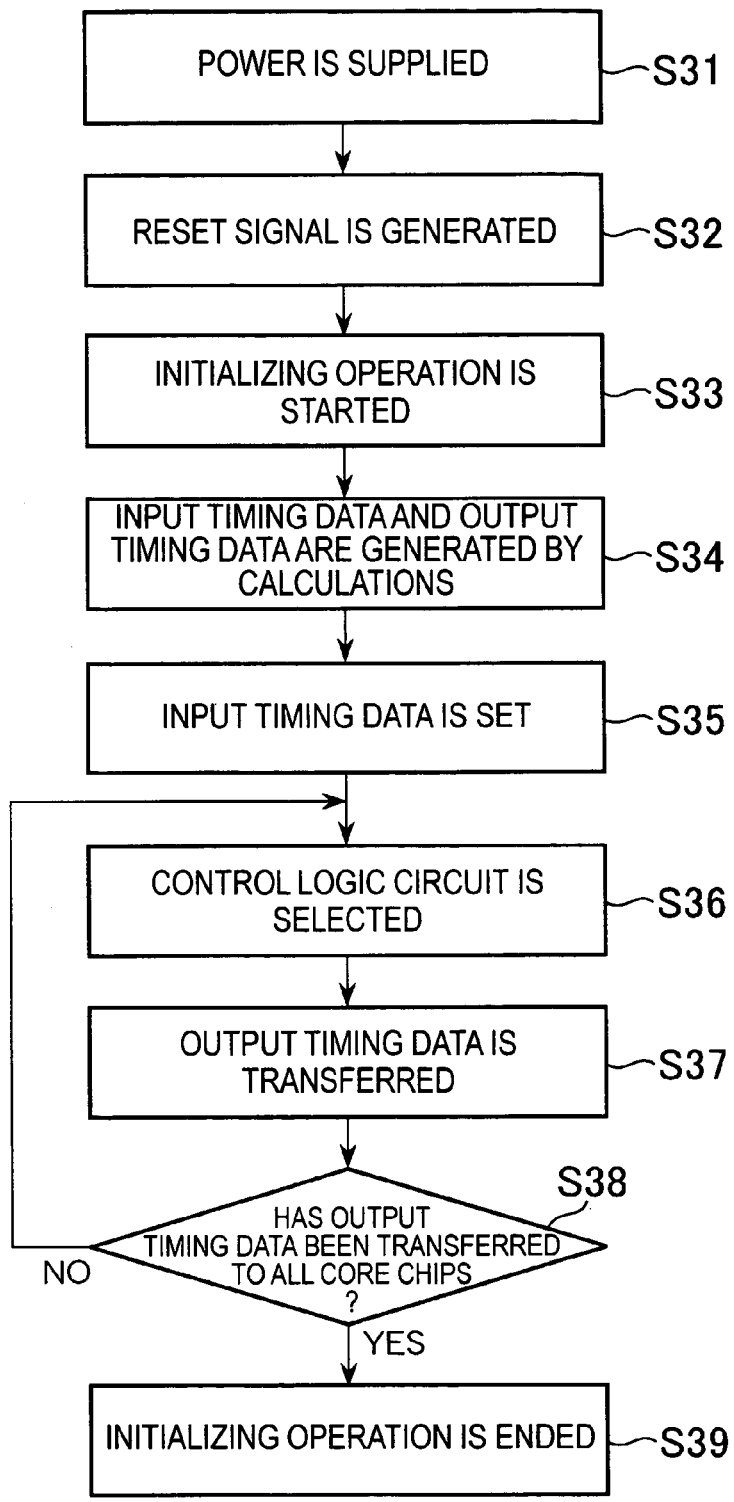
FIG. 9 is a flowchart for explaining an operation to be performed at the time of power activation.

FIG. 9 is a flowchart for explaining an operation to be performed at the time of power activation.

First, when power is supplied to the semiconductor device 10 (step S31), the power-on detecting circuits 43 and 71 generate reset signals (step S32), and an initializing operation starts in the interface chip IF and the core chips CC0 to CC7 (step S33).

In the initializing operation, the arithmetic circuit 210 performs calculations with the use of the adjustment codes CO, to generate the input timing data and the output timing data (step S34). As will be described later in greater detail, the arithmetic circuit 210 identifies the core chip with the lowest operation speed by comparing the adjustment codes CO corresponding to the respective core chips CC0 to CC7, and, based on the identified core chip, generates the input timing data and the output timing data. The generated input timing data is set in the input timing adjustment circuit 700 in the interface chip IF (step S35).

An address signal is then input from the interface chip IF to the core chips CC0 to CC7, to activate the control logic circuit 63 in one of the core chips CC0 to CC7 (step S36). The output timing data is transferred from the timing data storage circuit 200 via a through silicon via, to write the output timing data corresponding to the output timing adjustment circuit 400 in the activated control logic circuit 63 (step S37). In the transfer of the output timing data, a special-purpose through silicon via may be used, or a through silicon via (one of through silicon vias for address, for example) that is not being used currently (during the series of procedures according to the flowchart of FIG. 9 at the time of power activation) may be used.

The above described operation is performed on each of the core chips CC0 to CC7 by switching layer addresses. When the transfer of the output timing data is completed with respect to all the core chips CC0 to CC7 (YES in step S38), the initializing operation comes to an end (step S39). In this manner, the corresponding output timing data is set in the output timing adjustment circuit 400 of each corresponding one of the core chips CC0 to CC7.

Figure 10:
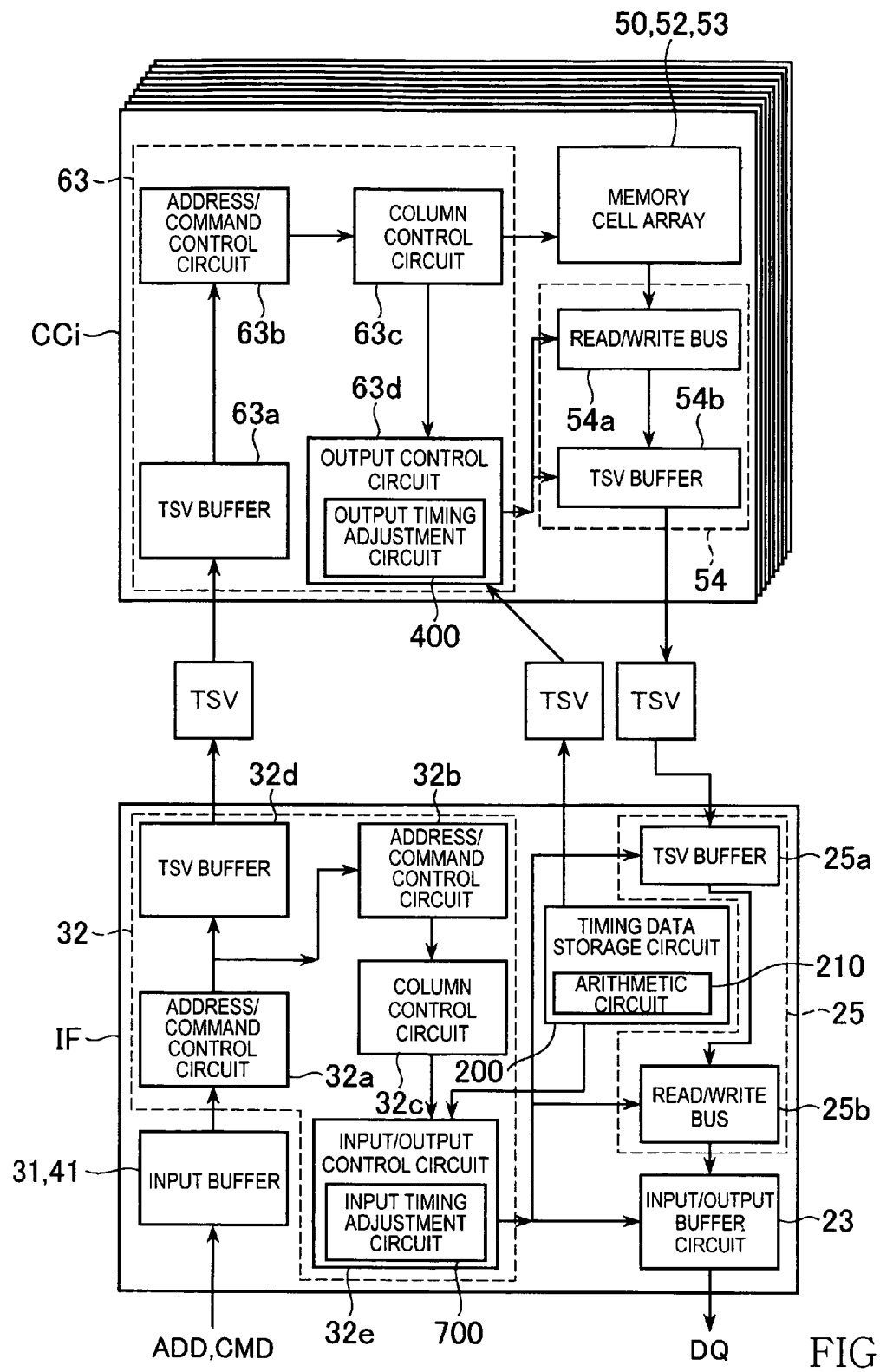
FIG. 10 is a schematic block diagram for explaining the overall flow of signals during a read operation.

FIG. 10 is a schematic block diagram for explaining the overall flow of signals during a read operation.

As shown in FIG. 10, an address signal ADD and a command signal CMD to be input from the outside to the interface chip IF are supplied to the input buffers 31 and 41 in the interface chip IF. Those signals are supplied to the command decoder 32 and the likes, and are subjected to predetermined processing at address/command control circuits 32*a* and 32*b*, a column control circuit 32*c*, and an input/output control circuit 32*e* included in the command decoder 32. The control signals generated as a result are supplied to the data latch circuit 25. The data latch circuit 25 includes a TSV buffer 25*a* and a read/write bus 25*b*. The control signal generated from the command decoder 32 is supplied to the data latch circuit 25 and the input/output buffer circuit 23, to control the data input/output timing.

The input/output control circuit 32*e* includes the input timing adjustment circuit 700, and the input timing data transferred from the timing data storage circuit 200 at the time of power activation is set in the input timing adjustment circuit 700. The input timing data is supplied to the TSV buffer 25*a* and the read/write bus 25*b* included in the data latch circuit 25, to control the timing to input read data to be supplied from the core chips CC0 to CC7 to the interface chip IF.

A TSV buffer 32*d* included in the command decoder 32 is connected to each of the core chips CC0 to CC7 via a through silicon via TSV. The internal command ICMD supplied from the TSV buffer 32*d* is received by a TSV buffer 63*a* included in the control logic circuit 63 in each core chip, and is subjected to predetermined processing at an address/command control circuit 63*b*, a column control circuit 63*c*, and an output control circuit 63*d*. The output control circuit 63*d* includes the output timing adjustment circuit 400, and, as described above, the output timing data transferred from the timing data storage circuit 200 in the interface chip IF at the time of power activation is set in the output timing adjustment circuit 400.

The output timing data is supplied to a read/write bus 54*a* and a TSV buffer 54*b* included in the data control circuit 54 in each core chip, to control the timing to output read data from the core chips CC0 to CC7 to the interface chip IF. The stored information of more than one bit that has been accessed in relation to one read command is connected from the memory cell array 50 to the data control circuit 54 that processes read data of eight bits (=number of prefetched bits) per I/O (DQ) via the sense circuit 53 and the column decoder 52.

Figure 11:
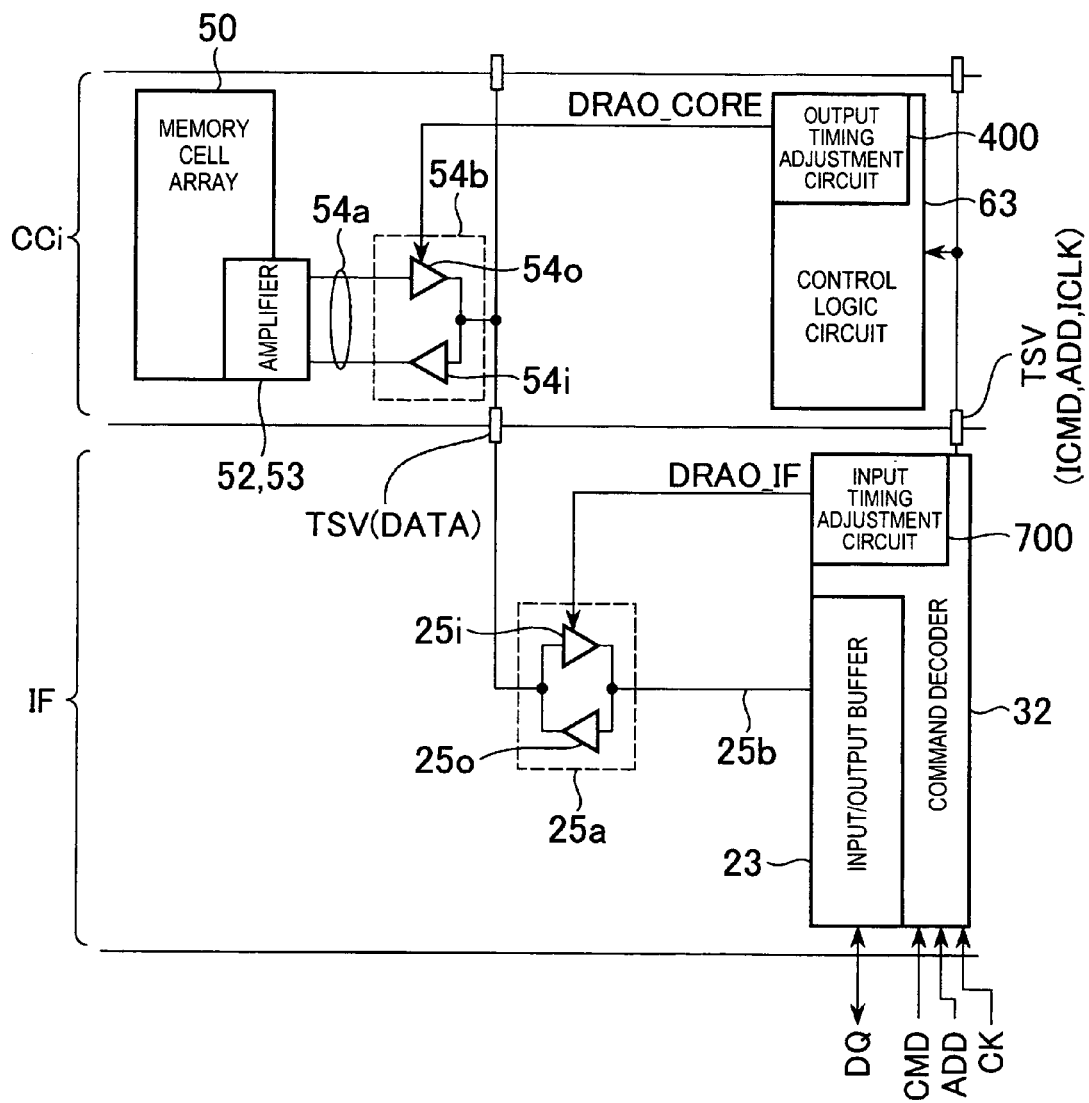
FIG. 11 is a schematic view for explaining the flow of read data.

FIG. 11 is a schematic view for explaining the flow of read data.

As shown in FIG. 11, the TSV buffer 54*b* in the data control circuit 54 in each core chip includes a data output circuit 54*o* and a data input circuit 54*i*. The input terminal of the data output circuit 54*o* and the output terminal of the data input circuit 54*i* are connected to various amplifiers included in the sense circuit 53 and the column decoder 52 and the like via the read/write bus 54*a*, and are lastly connected to the memory cell array 50.

An output timing signal DRAO_CORE is supplied to the data output circuit 54*o* from the output timing adjustment circuit 400 in the control logic circuit 63. In other words, the data output circuit 54*o* is a clocked driver that is controlled by the output timing signal DRAO_CORE. The output timing signal DRAO_CORE is a signal that designates the operation timing of the data output circuit 54*o* (or the signal that outputs the read data signal read from the memory cell array 50 on the read/write bus 54*a*, to a through silicon via TSV), and the timing to activate the output timing signal DRAO_CORE is adjusted by the set output timing data.

Read data (a read data signal) that is input to the interface chip IF via a through silicon via TSV is supplied to a data input circuit 25*i* included in the TSV buffer 25*a*. The TSV buffer 25*a* also includes a data output circuit 25*o*. The input terminal of the data output circuit 25*o* and the output terminal of the data input circuit 25*i* are connected to the input/output buffer 23 via the read/write bus 25*b*.

An input timing signal DRAO_IF is supplied to the data input circuit 25*i* from the command decoder 32 of the interface chip IF. In other words, the data input circuit 25*i* is a clocked receiver that is controlled by the input timing signal DRAO_IF. The input timing signal DRAO_IF is the signal that designates the timing to allow (the timing to capture) the data input circuit 25*i* to capture read data that is output from a core chip to the interface chip IF via a through silicon via TSV. The timing to activate the input timing signal DRAO_IF is adjusted by the set input timing data.

Figure 12:
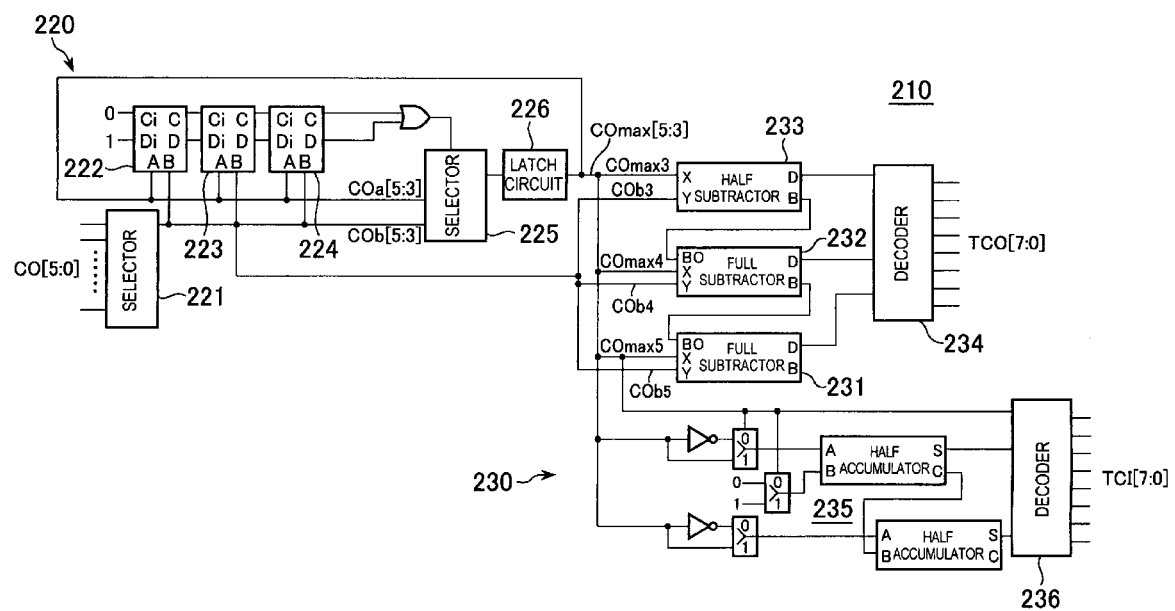
FIG. 12 is a circuit diagram of the arithmetic circuit 210.

FIG. 12 is a circuit diagram of the arithmetic circuit 210.

As shown in FIG. 12, the arithmetic circuit 210 includes a maximum value detecting unit 220 and a difference calculating unit 230. The maximum value detecting unit 220 is a circuit that compares the adjustment codes CO corresponding to the core chips CC0 to CC7, to extract the maximum value or the adjustment code COmax corresponding to the core chip with the lowest operation speed. The difference calculating unit 230 is a circuit that calculates the differences between the adjustment code COmax extracted and the adjustment codes CO corresponding to the respective core chips CC0 to CC7 and the interface chip IF, to generate the input timing data and the output timing data.

More specifically, the maximum value detecting unit 220 includes: a selector 221 that extracts three higher-order bits CO [5:3] from an adjustment code CO [5:0] among the adjustment codes CO corresponding to the core chips CC0 to CC7 set in the timing data storage circuit 200, and outputs those bits; and three comparators 222 through 224 to which those three higher-order bits CO [5:3] are input. The reason that only the three higher-order bits CO [5:3] are used among the set 6-bit output timing data CO [5:0] is that the measurement accuracy of the process monitor circuit 100 is taken into consideration. Here, CO [5:3] is COb [5:3] and COi [5:3] (i=0 through 7), which will be described later. Further, "i" represents the layer number of each core chip, and "COb" is expressed in the layer of an arbitrary core chip.

Figures 13A, 13B:
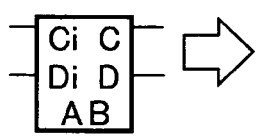
FIGS. 13A and 13B are truth tables for explaining functions of comparators 222 through 224.

FIGS. 13A and 13B are truth tables for explaining the functions of the comparators 222 to 224. FIG. 13A is a truth table based on the logic level of an input terminal Ci, and FIG. 13B is a truth table based on the logic level of an input terminal Di.

As shown in FIG. 13A, in a case where a high-level signal is input to the input terminal Ci, the comparators 222 to 224 each output a high-level signal from an output terminal C, regardless of the logic levels of input terminals A and B. In a case where a low-level signal is input to the input terminal Ci, on the other hand, a high-level signal is output from the output terminal C only when the input terminal A is at the high level while the input terminal B is at the low level (A>B). In other cases, a low-level signal is output from the output terminal C.

As shown in FIG. 13B, in a case where a low-level signal is input to the input terminal Di, the comparators 222 to 224 each output a low-level signal from the output terminal D, regardless of the logic levels of the input terminals A and B. In a case where a high-level signal is input to the input terminal Di, on the other hand, a high-level signal is output from the output terminal D only when the logic levels of the input terminals A and B are the same (A=B). In other cases, a low-level signal is output from the output terminal D.

Since the comparators 222 to 224 having such functions are cascade-connected from the higher-order bit side, the comparators 222 to 224 each compare the adjustment code COa [5:3] supplied to the input terminal A with the adjustment code COb [5:3] supplied to the input terminal B, and set the outputs Cout and Dout to the low level if the following relationship is established, COa[5:3]<COb[5:3].

With this arrangement, a selector 225 selects the adjustment code COb [5:3], and supplies the selected adjustment code COb [5:3] to a latch circuit 226. On the other hand, if the following relationship is established, COa[5:3]≧COb[5:3], one of the outputs Cout and Dout is set at the high level, and the selector 225 selects the adjustment code COa [5:3].

The adjustment code CO latched in the latch circuit 226 is used as the adjustment code COa [5:3]. Accordingly, by performing the above comparing operation on the adjustment codes CO corresponding to the respective core chips CC0 to CC7, the adjustment code COmax [5:3] with the largest value is eventually latched in the latch circuit 226.

The adjustment code COmax [5:3] obtained in this manner is supplied to the difference calculating unit 230. The difference calculating unit 230 includes full subtractors 231 and 232 and a half subtractor 233. The corresponding bits of the adjustment code COmax [5:3] and the corresponding bits of the adjustment codes COi [5:3] (i=0 through 7) that are output from the selector 221 are input to those subtractors. Accordingly, the differences D [2:0] expressed as:

COmax[5:3]−COi[5:3]

are output from the subtractors. After being decoded by a decoder 234, the differences D [2:0] are output as output timing data TCO [7:0]. In this manner, the output timing data TOO [7:0] corresponding to the respective core chips CC0 to CC7 are generated.

The difference calculating unit 230 includes a converter 235 that converts the adjustment code COmax [5:3] into adjustment codes for the interface chip. After the outputs are decoded by a decoder 236, the input timing data TCI [7:0] are output.

Through the above calculations, the input timing data TCI [7:0] for the interface chip IF and the output timing data TCO [7:0] for the core chips CC0 to CC7 are generated.

Figure 14:
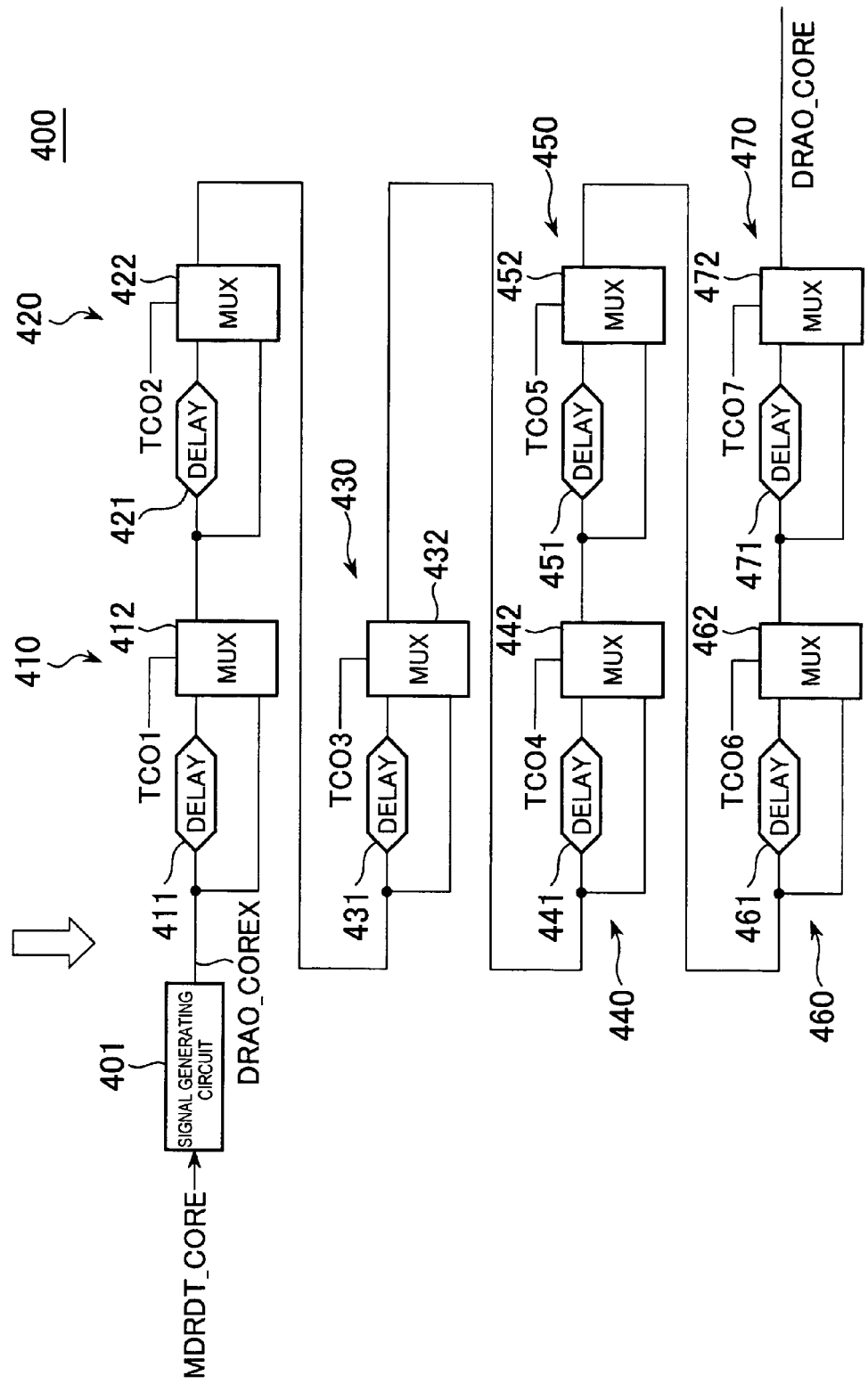
FIG. 14 is a circuit diagram of the output timing adjustment circuit 400.

FIG. 14 is a circuit diagram of the output timing adjustment circuit 400.

As shown in FIG. 14, the output timing adjustment circuit 400 includes: a signal generating circuit 401 that generates a primary signal DRAO_COREX from a signal MDRDT_CORE; and delay circuits 410 to 470 that are cascade-connected and transmit the primary signal DRAO_COREX. The output from the delay circuit 470 of the last stage is used as the output timing signal DRAO_CORE. The respective delay circuits 410 to 470 are formed with delay elements 411 to 471 and multiplexers 412 to 472. Based on the logic levels of corresponding select signals TCO1 to TCO7, a check is made to determine whether the delay elements 411 to 471 should be skipped (or delays should be caused). The select signals TCO1 to TCO7 are the respective bits of the output timing data TCO [7:0]. Accordingly, when all the delay elements 411 to 471 are skipped, the amount of delay in the output timing adjustment circuit 400 is minimized, and the timing to activate the output timing signal DRAO_CORE becomes the earliest. On the other hand, in a case where the primary signal DRAO_COREX passes through all the delay elements 411 to 471, the amount of delay in the output timing adjustment circuit 400 is maximized, and the timing to activate the output timing signal DRAO_CORE becomes the latest.

FIG. 15 is a table for explaining the relationships between the output timing data TCO [7:0] and the set amounts of delay. As shown in FIG. 15, the amount of delay can be adjusted among eight levels, depending on the output timing data TCO [7:0]. The same goes for the input timing data TCI [7:0], and the amount of delay can be adjusted among eight levels, depending on the input timing data TCI [7:0]. The reference values (defaults) are based on the test results detected by the process monitor 100 in the interface chip IF and the replica circuits 300 in the respective core chips, and the operation speed of the slowest chip determined from the test results by the arithmetic circuit 210 in the interface chip IF. Positive offset values (+1 to +7) at seven levels different from the respective default values are disclosed by the default values. All the seven amounts of delay are supplied to the chips other than the chip with the lowest operation speed, and the timing to output read data of the other core chips (the clock timing of the clocked drivers) is made equal to the timing to output the read data of the slowest core chip. The timing to input the read data of the interface chip (the clock timing of the clocked receiver) is made equal to the timing to output the read data of the slowest core chip.

FIGS. 16A to 16D are timing charts for explaining the effects of adjustments made by the input timing adjustment circuit 700 and the output timing adjustment circuit 400.

Figure 16:
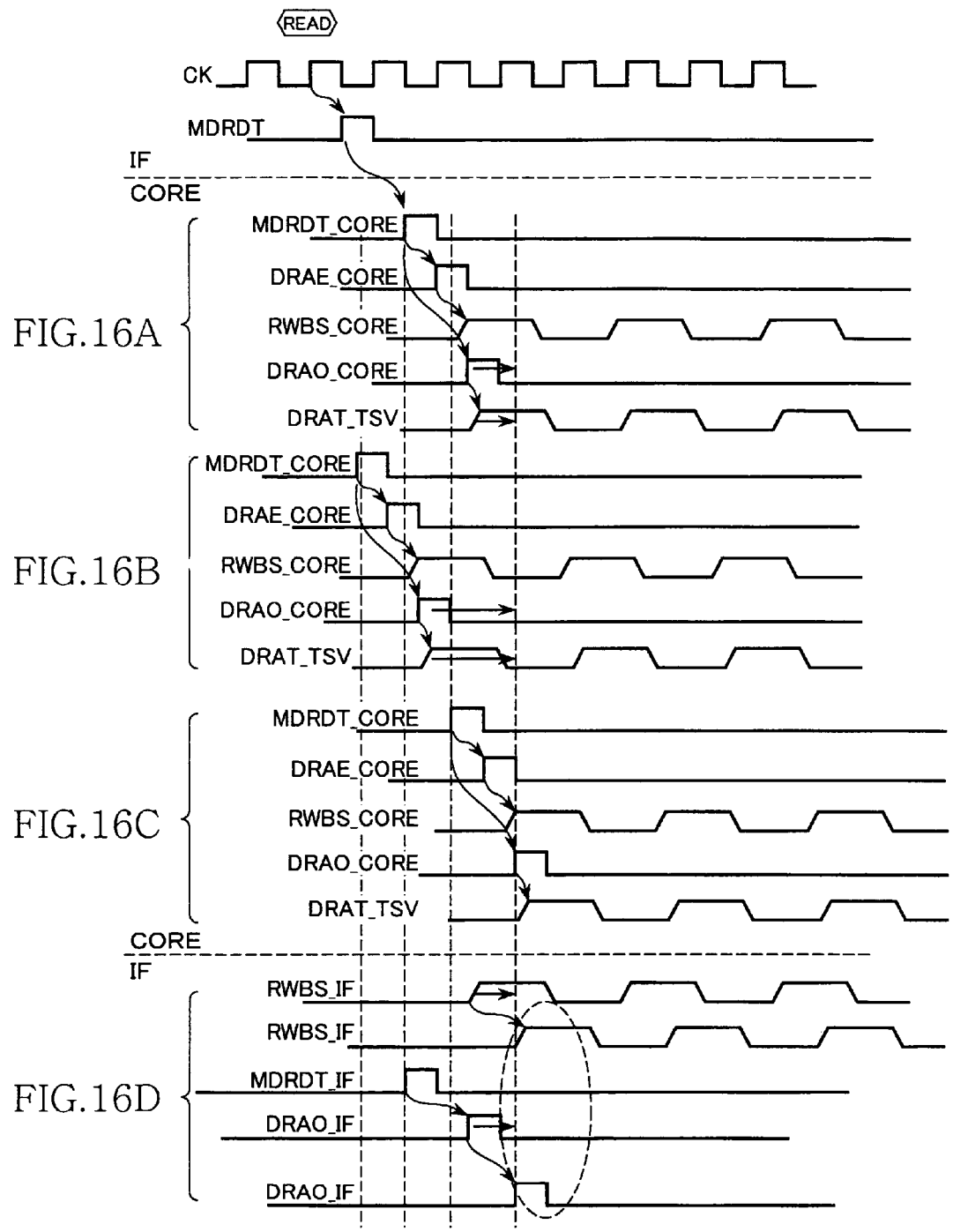
FIGS. 16A through 16D are timing charts for explaining the effects of adjustments made by the input timing adjustment circuit 700 and the output timing adjustment circuit 400.

The waveforms shown in FIGS. 16A to 16C are signal waveforms observed on the sides of the respective core chips. FIG. 16A illustrates a case where the operation speed of a first core chip is the same as the operation speed of the interface chip IF. FIG. 16B illustrates a case where the operation speed of a second core chip 1 is higher than the operation speed of the interface chip IF. FIG. 16C illustrates a case where the operation speed of a third core chip 2 is lower than the operation speed of the interface chip IF. The waveforms shown in FIG. 16D are the signal waveforms observed on the side of the interface chip IF. The waveforms shown in FIGS. 16A to 16C may be regarded as being resulted from the respective manufacturing conditions in one core chip.

In FIGS. 16A to 16D, "_IF", "_CORE", and "_TSV" that are added to signals described below indicate signals in the interface chip IF, signals in the core chips, and signals in the through silicon vias TSV, respectively. Further, each signal is related to FIG. 10. A signal MDRDT is a signal that defines the internal read command to be generated by the address/command control circuit 32a in the command decoder 32 in the interface chip IF, based on a read command READ supplied from the outside. A signal MDRDT_IF is a signal that defines the internal read command to be generated by the address/command control circuit 32b. A signal MDRDT_CORE is a signal that defines the internal read command generated by the address/command control circuit 63b from the internal read command transferred to a core chip. A signal DRAE_CORE is a signal that is generated by the column control circuit 63c and defines the timing to output read data of the memory cell array to the read/write bus 54a. A signal RWBS_CORE is a signal that defines read data on the read/write bus 54a. A signal DRAO_CORE is a signal that is generated by the output timing adjustment circuit 400 and defines the operation timing (the drive timing) of the TSV buffer 54b. A signal DATA_TSV is a signal that defines read data that is read from the memory cell array on a through silicon via TSV. A signal RWBS_IF is a signal that defines read data on the read/write bus 25*b*. A signal DRAO_IF is a signal that is generated by the input/output control circuit 32*e* and defines the operation timing (the reception timing or latch timing) of the TSV buffer 25*a*. A signal MDRDT_IF is an internal read command that is delayed in the interface chip IF.

As shown in FIGS. 16A to 16C, there are differences in operation speed among the core chips. If the operation speed of the core chip shown in FIG. 16C is the lowest among the chips in the semiconductor device 10, the amount of delay in the output timing data is increased in each of the core chips illustrated in FIGS. 16A and 16B. In this manner, the amount of delay is varied so that the timing to activate the output timing signal DRAO_CORE becomes equivalent to the operation speed of the core chip illustrated in FIG. 16C. In other words, those amounts of delay are defined by the differences among the adjustment codes. Accordingly, the core chips illustrated in FIGS. 16A and 16B are synchronized with the timing to activate the output timing signal DRAO_CORE in the core chip illustrated in FIG. 16C. Further, as shown in FIG. 16D, the timing to activate the input timing signal DRAO_IF on the side of the interface chip IF is also delayed to be synchronized with (or to become equal to) the timing to activate the output timing signal DRAO_CORE of the core chip illustrated in FIG. 16C.

In the above manner, the periods of time required from issuance of the read command from the interface chip IF to the outputting of read data from the respective core chips CC0 to CC7 (the second latency), and the periods of time required for the interface chip IF to allow (latch) the inputs of read data in accordance with read commands (the first latency) become uniform. More specifically, a first time that is uniquely set in each of the core chips CC0 to CC7 according to the respective manufacturing conditions and the likes is adjusted to a second time so as to become equal to the first time set in the slowest core chip among the core chips. Meanwhile, a third time that is uniquely set in the interface chip IF according to the manufacturing conditions and the likes is adjusted to a fourth time so as to become equal to the first time set in the slowest core chip among the core chips. The "uniform" timings in the present invention do not require complete synchronism, but include situations where the time difference cannot be shortened any more due to the circuit structure. For example, since the timing to output read data is adjusted by an output timing adjustment circuit in this embodiment, the timing to output read data cannot be fine-adjusted with precision higher than the adjustment pitch of the output timing adjustment circuit. In other words, it is not possible to make smaller time adjustments than the minimum delay time or the minimum cut time that is the minimum resolution capability in time adjustments. Likewise, since the timing to allow inputting of read data is adjusted by an input timing adjustment circuit, it is not possible to make fine adjustments on the read data input allowance timing with higher precision than the adjustment pitch of the input timing adjustment circuit. Therefore, the situation where the time differences are minimized by the input timing adjustment circuit 700 and the output timing adjustment circuit 400 is the situation where the timings are "uniform" in the present invention.

Figure 17:
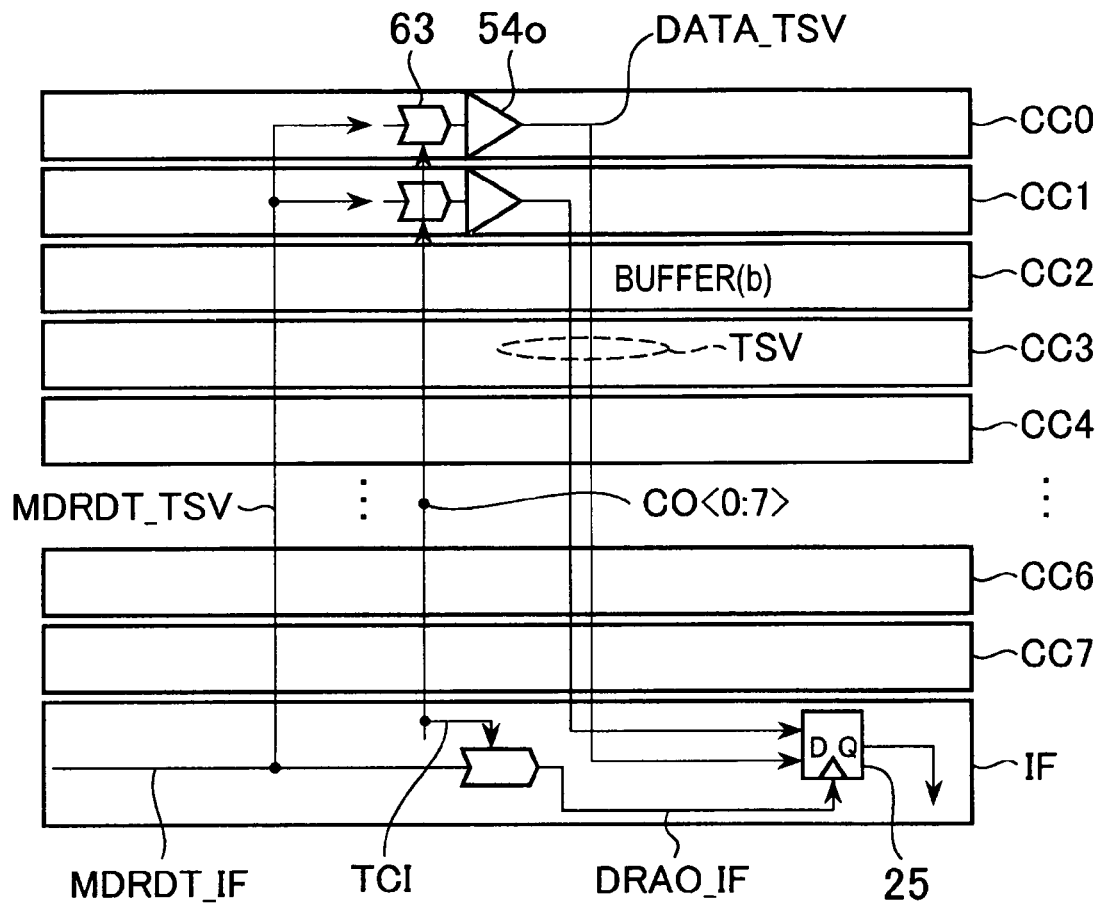
FIG. 17 is a schematic view showing the flow of a read command and read data.

FIG. 17 is a schematic view showing the flow of a read command and read data.

As shown in FIG. 17, a read command MDRDT_TSV_CORE that is output from the TSV buffer 32*d* of the interface chip IF in relation to the signal MDRDT in the interface chip IF is collectively supplied to each of the core chips CC0 to CC7. Only one core chip that has a matching layer address receives the read command MDRDT_TSV. The control logic circuit 63 in the core chip that has received the read command MDRDT_TSV_CORE generates a read command MDRDT_CORE and a signal DRAO_CORE, and activates the data output circuit 54*o* based on the amount of delay set in the output timing adjustment circuit 400. The data output circuit 54*o* supplies read data DATA_TSV to the interface chip IF via a through silicon via TSV. The through silicon via TSV through which the read data DATA_TSV is transmitted is shared among the core chips CC0 to CC7. However, since only one core chip having a matching layer address can receive the effective read command MDRDT_CORE, as described above, read data is not output from two or more core chips to a single through silicon via TSV at the same time, and there is no possibility of a bus fight.

The read data DATA_TSV supplied from a core chip to the interface chip IF via a through silicon via TSV is latched in the data latch circuit 25 in the interface chip IF. The latch timing (or the timing to allow the data input circuit 25*i* to capture the read data DATA_TSV into the interface chip IF) is determined by the input timing signal DRAO_IF adjusted based on the amount of delay set in the input timing adjustment circuit 700 in the interface chip IF. More specifically, the read data that are output from the respective core chips reach the location of the data latch circuit 25 of the interface chip at the same time.

As described above, in this embodiment, with the operation speed of the slowest core chip being the reference speed, the read data output timings in the other core chips are delayed, and the read data input allowance timing in the interface chip IF is delayed. Therefore, even if the operation speed of the interface chip IF or the operation speed of any one of the core chips CC0 to CC7 differs from a designed value due to the process conditions (the manufacturing conditions), the data latch circuit 25 in the interface chip IF can accurately latch the read data DATA_TSV at the same time.

Figure 18:
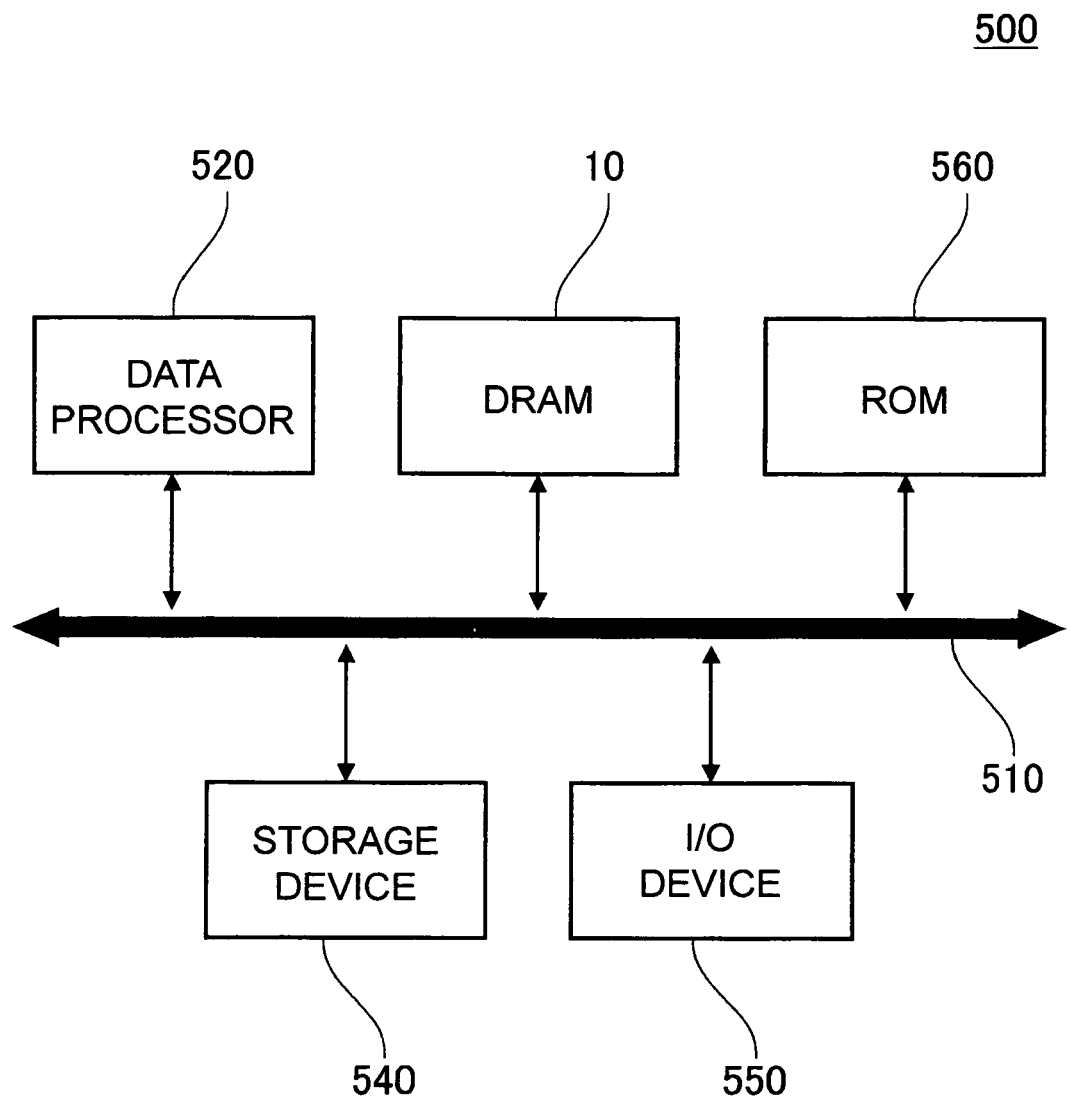
FIG. 18 is a block diagram showing the configuration of a data processing system 500 using the semiconductor device 10.

FIG. 18 is a block diagram showing the configuration of a data processing system 500 using the semiconductor device 10 according to this embodiment.

The data processing system 500 shown in FIG. 18 has a configuration in which a data processor 520 and the semiconductor device (DRAM) 10 according to this embodiment are mutually connected via a system bus 510. The data processor 520, for example, includes micro-processor (MPU) or digital signal processor (DSP). But it is not limited to them. In FIG. 18, for the sake of shorthand, the data processor 520 and the DRAM 10 are connected via the system bus 510. But they may be connected using a local bus not via the system bus 510. The data processor 520 includes a memory controller for controlling the DRAM 10. A read command is issued from the data processor 520 to the DRAM 10 and a read data is output from the DRAM 10 to the data processor 520.

In FIG. 18, for the sake of shorthand, only one set of the system bus 510 is drawn. But a plurality of system buses 510 may be provided in serial or parallel manner via some connectors etc., if needed. In the data processing system 500 shown in FIG. 18, a storage device 540, I/O device 550, and ROM 560 are also connected to the system bus 510. But these components are not in dispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to.

I/O device 550 can be only one of the input device and the output device. Though only one component is drawn for each of the components shown in FIG. 18, the number of each of the components is not limited to one. The data processing system 500 can include a plurality of each of the components.

In the embodiments of the present invention, the controller issues commands concerning read commands to the interface chip. Upon receipt of a command from the controller, the interface chip issues read commands to core chips. Upon receipt of a read command, one of the core chips outputs read data that is the information about the memory cell array corresponding to the read command, to the interface chip. Receiving the read data from the one of the core chips, the interface chip outputs the read data to the controller. The commands (read commands in systems) issued by the controller are commands that are standardized by industry organizations specializing in controlling known semiconductor devices. The read commands issued from the interface chip to the core chips are control signals inside the semiconductor chips. The same goes for the read data.

It is apparent that the present invention is not limited to the above embodiments, but may be modified and changed without departing from the scope and spirit of the invention.

For example, in the embodiment, the DDR3-type SDRAMs are used as the plural core chips having the same function. However, the present invention is not limited thereto. Accordingly, the core chip may be a DRAM other than the DDR3-type and a semiconductor memory (SRAM (Static Random Access Memory), PRAM (Phase-change Random Access Memory), MRAM (Magnetic Random Access Memory) or a flash memory) other than the DRAM. The core chips may be plural semiconductor chips that have functions other than the functions of the semiconductor memory, which are equal to or different from each other. That is, the core chips may be semiconductor devices, such as a CPU (Central Processing Unit), an MCU (Micro Control Unit), a DSP (Digital Signal Processor), an ASIC (Application Specific Integrated Circuit), and an ASSP (Application Specific Standard Circuit). All of the core chips do not need to be laminated and all or part of the core chips may be two-dimensionally disposed. The number of core chips is not restricted to 8.

In the above described embodiment, the output timing data is stored in the timing data storage circuit 200 in the interface chip IF. In the present invention, however, this aspect is not necessary, and the output timing data may be stored in the respective core chips CC0 to CC7. Further, the adjustment codes obtained by the process monitor circuit 100 do not need to be temporarily stored in the table in a tester, but may be written directly into the timing data storage circuit 200, or may be written into the timing data storage circuit 200 after being temporarily stored in a cache in the interface chip IF.

Further, the arithmetic circuit 210 is not necessarily provided in the interface chip IF, and calculated input timing data and calculated output timing data may be stored into the timing data storage circuit 200. Also, the calculations are not necessarily performed on the semiconductor device side, but may be performed on the tester side.

In the above described embodiment, the replica circuits 300 are provided in the respective core chips CC0 to CC7. In the process monitoring operation, the actual signal path may be used instead of replica circuits 300. The actual signal path is formed with various kinds of signal generating circuits starting from the address/command control circuit 63b in each core chip to the output timing adjustment circuit 400 in FIG. 10. In other words, the actual signal path is the signal path from the signal MDRDT_CORE to the signal DRAO_CORE (the default value of an amount of delay). Further, instead of the variable delay circuit 110, the actual signal path formed with various kinds of signal generating circuits starting from the address/command control circuit 32a in the interface chip IF to the input/output control circuit 32e or the actual signal path from the signal MDRDT_IF to the signal DRAO_IF may be used.

The fundamental technical concept of the present invention is not limited to that. For example, the core chips have been described as chips of semiconductor memories having the same function. However, the fundamental technical concept of the present invention is not limited to that, and the core chips may have the same function as one another or different functions from one another. Specifically, the interface chip and the core chips may be silicon chips each having a unique function. For example, the core chips may be DSP chips having the same function, and may have an interface chip (ASIC) shared among the core chips. Preferably, the core chips have the same function as one another, and are manufactured with the use of the same mask. However, the characteristics after the manufacture might vary due to the in-plane distribution in the same wafer, differences among wafers, differences among lots, and the likes. Further, the core chips each have a memory function, but may also have different functions from one another (a first core chip is a DRAM, a second chip is a SRAM, a third chip is a nonvolatile memory, and a fourth chip is a DSP). The core chips may be manufactured with the use of different manufacturing masks from one another, and may have an interface chip (ASIC) shared among the core chips.

The present invention may also be applied to all semiconductor products such as CPUs (Central Processing Units), MCUs (Micro Control Units), DSPs (Digital Signal Processors), ASICs (Application Specific Integrated Circuits), and ASSPs (Application Specific Standard Circuits), as long as they are COCs (Chip-on-Chips) that use TSVs. The devices to which the present invention is applied may also be used as the semiconductor devices in SOCs (System-on-Chips), MCPs (Multi Chip Packages), POPs (Package-On-Packages), and the likes.

The transistors may be field effect transistors (FETs) or bipolar transistors. The present invention may be applied to various kinds of FETs such as MISs (Metal-Insulator Semiconductors) and TFTs (Thin Film Transistors), other than MOSs (Metal Oxide Semiconductors). The present invention may be applied to various kinds of FETs such as transistors. The transistors may be other transistors than FETs. The transistors may partially include bipolar transistors. Also, p-channel transistors or PMOS transistors are typical examples of the transistors of the first conductivity type, and n-channel transistors or NMOS transistors are typical examples of the transistors of the second conductivity type. Further, the substrate may not necessarily be a p-type semiconductor substrate, and may be an n-type semiconductor substrate, or a semiconductor substrate of a SOI. (Silicon on Insulator) structure, or a semiconductor substrate of some other type.

Further, the circuit forms of various kinds of testing circuits (testing circuits in the core chips, a testing circuit in the interface chip), nonvolatile memory circuits, buffers in the core chips, a test entry circuit in the interface chip, a test signal generating circuit and its input external terminal, and the likes are not limited to the circuit forms disclosed in the embodiment.

Further, the structure of the through silicon via TSV is not matter. The circuit forms of TSV buffers (driver, and receiver) are also not matter.

Various combinations and selections of the components disclosed herein may be made within the scope of the invention. In other words, the present invention of course includes various changes and modifications that are obvious to those skilled in the art according to all the disclosure including the claims and the technical concept.

What is claimed is:

1. A semiconductor device comprising:
a plurality of core chips each including an output terminal; and
an interface chip that includes an input terminal electrically connected to the output terminals in common, and a data input circuit that receives a plurality of read data supplied from the output terminals via the input terminal, the interface chip issuing at least a read command to the core chips, wherein
each of the core chips includes a data output circuit that outputs the read data to the output terminal in response to the read command, and an output timing adjustment circuit that adjusts an output period from a first time to a second time, the output period being a period of time from reception of the read command to outputting of the read data from the data output circuit to the output terminal, the first time being a minimum time of the output period,
the interface chip includes an input timing adjustment circuit that adjusts an input period from a third time to a fourth time, the input period being a period of time from issuance of the read command to capturing of the read data from the input terminal into the data input circuit, the third time being a minimum time of the input period, and
the second times and the fourth time are substantially same as longest time among the first times and the third time.

2. The semiconductor device as claimed in claim 1, wherein the input timing adjustment circuit adjusts the input period so as to match the fourth time with longest time among the first times.

3. The semiconductor device as claimed in claim 2, wherein each of the output timing adjustment circuits other than one of the output timing adjustment circuits included in the core chip having longest time among the first times adjusts the output period so as to match the second time with the longest time among the first times.

4. The semiconductor device as claimed in claim 1, wherein
the interface chip further includes a process monitor circuit that detects operation speed differences between a first operation speed of each of the core chips and a second operation speed of the interface chip,
each of the output timing adjustment circuits adjusts the output period based on an difference between an operation speed of respective core chip and an operation speed of slowest one of core chips and the interface chip, and
the input timing adjustment circuit adjusts the input period based on an difference between an operation speed of the interface chip and an operation speed of slowest one of core chips and the interface chip.

5. The semiconductor device as claimed in claim 4, wherein each of the output timing adjustment circuits adjusts the output period based on respective operation speed difference and the operation speed difference between the second operation speed and the first operation speed of the slowest core chip.

6. The semiconductor device as claimed in claim 5, wherein the input timing adjustment circuit adjusts the input period based on the operation speed difference between the first operation speed of the slowest core chip and the second operation speed.

7. The semiconductor device as claimed in claim 4, wherein
each of the core chips includes a fixed delay circuit that has a specific amount of delay that is predetermined by process conditions of the core chips,
the process monitor circuit includes: a variable delay circuit that is capable of varying an amount of delay that is determined by process conditions of the interface chip and an adjustment code; and a delay control circuit that varies the adjustment code to cause the amount of delay in the variable delay circuit to match the amounts of delay in the fixed delay circuits,
each of the output timing adjustment circuits adjusts the output period based on output timing data containing the adjustment code or a code generated based on the adjustment code, and
the input timing adjustment circuit adjusts the input period based on input timing data containing the adjustment code or a code generated based on the adjustment code.

8. The semiconductor device as claimed in claim 7, wherein
the interface chip further includes a timing data storage circuit that stores the adjustment code or the output timing data, and
the adjustment code or the output timing data stored in the timing data storage circuit is supplied to each corresponding core chip at a time of power activation.

9. The semiconductor device as claimed in claim 1, wherein the core chips are stacked.

10. The semiconductor device as claimed in claim 9, wherein
the core chips having a plurality of through silicon vias each penetrating through a semiconductor substrate, and
the through silicon vias that transmit the read data are electrically connected to one another among the core chips.

11. The semiconductor device as claimed in claim 9, wherein the core chips and the interface chip are stacked.

12. The semiconductor device as claimed in claim 1, wherein
the interface chip has a front-end function that communicates with outside at a first operating frequency, and
each of the core chips has a back-end function that communicates with the interface chip at a second operating frequency that is lower than the first operating frequency.

13. The semiconductor device as claimed in claim 1, wherein a number of bits of read data outputted from the interface chip to outside at one time is less than a number of bits of read data outputted from the core chips to the interface chip at one time.

14. The semiconductor device as claimed in claim 13, wherein the interface chip converts the read data supplied in parallel from one of the core chips into a serial read data, and outputs the serial read data to the outside.

15. The semiconductor device as claimed in claim 14, wherein
each of the core chips further includes a memory cell array that stores a plurality of data, and
each of the core chips outputs the read data in parallel comprising a plurality of prefetched data read from the memory cell array in one time in response to the read command.

16. A method for adjusting a semiconductor device comprising:
providing the semiconductor device that includes a plurality of core chips each including an output terminal, and an interface chip that includes an input terminal electrically connected to the output terminals in common;

detecting an operation speed difference between a first operation speed of each of the core chips and a second operation speed of the interface chip;

adjusting an output period in each of the core chips from a first time to a second time based on respective operation speed difference and an operation speed difference of the slowest core chip, the output period being a period of time in each of the core chips from reception of a read command issued from the interface chip to the core chips to outputting of read data to the interface chip, the first time being a minimum time of the output period, and adjusting an input period in the interface chip from a third time to a fourth time based on operation speed difference of the slowest core chip, the input period being a period of time in the interface chip from issuance of the read command to capturing of read data output from the core chips, thereby the first time of the slowest core chip, the second times of the core chips other than the slowest core chips, and the fourth time of the interface chip are substantially same as each other.

17. The method as claimed in claim 16, wherein each of the core chips includes a fixed delay circuit that has a specific amount of delay that is predetermined by process conditions of the core chips, the interface chip includes a variable delay circuit that is capable of varying an amount of delay that is determined by process conditions and adjustment code, and each difference between the second operation speed and the first operation speed is detected by varying the adjustment code to cause the amount of delay in the variable delay circuit to match each of the amounts of delay in the fixed delay circuits.

18. The method as claimed in claim 17, wherein output timing data containing the adjustment code or a code generated based on the adjustment code is stored into the interface chip.

19. The method as claimed in claim 18, wherein the interface chip supplies the adjustment code or the output timing data to each corresponding one of the core chips at the time of power activation.

20. A data processing system comprising:

a semiconductor device; and a controller connected to the semiconductor device, wherein the semiconductor device comprising:

a plurality of core chips each including an output terminal; and an interface chip that includes an input terminal electrically connected to the output terminals in common, and a data input circuit that receives a plurality of read data supplied from the output terminals via the input terminal, the interface chip issuing at least a read command to the core chips, wherein each of the core chips includes a data output circuit that outputs the read data to the output terminal in response to the read command, and an output timing adjustment circuit that adjusts an output period from a first time to a second time, the output period being a period of time from reception of the read command to outputting of the read data from the data output circuit to the output terminal, the first time being a minimum time of the output period, the interface chip includes an input timing adjustment circuit that adjusts an input period from a third time to a fourth time, the input period being a period of time from issuance of the read command to capturing of the read data from the input terminal into the data input circuit, the third time being a minimum time of the input period, and the second times and the fourth time are substantially same as longest time among the first times and the third time, and wherein the controller issues a command related to the read command to the interface chip, the interface chip issues the read command to the core chips, upon receipt of the command from the controller, one of the core chips outputs the read data corresponding to the read command to the interface chip, upon receipt of the read command, the interface chip outputs the read data to the controller, upon receipt of the read data from one of the core chips.

* * * * *